US012660621B2

(12) United States Patent  
Ko et al.

(10) Patent No.: US 12,660,621 B2  
(45) Date of Patent: Jun. 16, 2026

(54) SEMICONDUCTOR PACKAGE

(71) Applicant: SAMSUNG ELECTRONICS CO., LTD., Suwon-si (KR)

(72) Inventors: Yeongbeom Ko, Suwon-si (KR); Junyun Kweon, Suwon-si (KR); Wonil Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 389 days.

(21) Appl. No.: 18/229,824

(22) Filed: Aug. 3, 2023

(65) Prior Publication Data

US 2024/0047296 A1 Feb. 8, 2024

(30) Foreign Application Priority Data

Aug. 8, 2022 (KR) ........................ 10-2022-0098784

(51) Int. Cl.
*H10W 40/22* (2026.01)
*H10W 74/10* (2026.01)
(Continued)

(52) U.S. Cl.
CPC ........ *H10W 40/228* (2026.01); *H10W 74/117* (2026.01); *H10W 90/401* (2026.01);
(Continued)

(58) Field of Classification Search
CPC ............. H01L 23/3677; H01L 23/3128; H01L 23/49833; H01L 24/16; H01L 25/0657; H01L 25/18; H01L 2224/16225; H01L 2225/06572; H01L 21/6835; H01L 25/105; H01L 2221/68359; H01L 25/03; H01L 23/49838; H01L 23/49816; H01L 23/5389; H01L 23/367; H01L 2225/1041; (Continued)

(56) References Cited

U.S. PATENT DOCUMENTS

| | | |
|---|---|---|
| 6,857,470 B2 | 2/2005 | Park et al. |
| 7,355,289 B2 | 4/2008 | Hess et al. |

(Continued)

FOREIGN PATENT DOCUMENTS

| | | |
|---|---|---|
| KR | 10-0508682 B1 | 8/2005 |
| KR | 10-2008-0044235 A | 5/2008 |

(Continued)

OTHER PUBLICATIONS

Communication dated Feb. 2, 2026, issued by the Korean Ministry of Intellectual Property in Korean Patent Application No. 10-2022-0098784.

*Primary Examiner* — Fernando L Toledo
*Assistant Examiner* — Shawn Shaw Muslim
(74) *Attorney, Agent, or Firm* — Sughrue Mion, PLLC

(57) ABSTRACT

A semiconductor package includes a first semiconductor chip, a lower redistribution structure electrically connected to the first semiconductor chip, an upper redistribution structure on the first semiconductor chip, a conductive post electrically connecting the upper redistribution structure to the lower redistribution structure, and a first wire connecting a lower surface of the first semiconductor chip with an upper surface of the lower redistribution structure to dissipate heat of the first semiconductor chip.

20 Claims, 21 Drawing Sheets

(51) Int. Cl.
    *H10W 90/00*       (2026.01)
    *H10B 80/00*       (2023.01)
    *H10W 90/22*       (2026.01)

(52) U.S. Cl.
    CPC ............. *H10B 80/00* (2023.02); *H10W 90/00*
        (2026.01); *H10W 90/22* (2026.01); *H10W*
        *90/724* (2026.01)

(58) Field of Classification Search
    CPC ..... H01L 2225/1052; H01L 2225/1058; H01L
        2225/1094; H10B 80/00
    See application file for complete search history.

(56)             References Cited

U.S. PATENT DOCUMENTS

| | | | |
|---|---|---|---|
| 8,372,741 B1 * | 2/2013 | Co | ...................... H01L 25/0657 |
| | | | 219/56.22 |
| 9,520,372 B1 | 12/2016 | Jeng et al. | |
| 2021/0111140 A1 * | 4/2021 | Jang | ...................... H10W 70/09 |
| 2021/0280552 A1 | 9/2021 | Tsai et al. | |
| 2022/0037224 A1 | 2/2022 | Yin et al. | |
| 2022/0208663 A1 * | 6/2022 | Sugimachi | ........ H01L 23/49575 |

FOREIGN PATENT DOCUMENTS

| | | |
|---|---|---|
| KR | 10-2008-0084300 A | 9/2008 |
| KR | 10-1571457 B1 | 11/2015 |
| KR | 10-1803614 B1 | 11/2017 |
| KR | 10-2021-0157781 A | 12/2021 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0098784, filed on Aug. 8, 2022, in the Korean Intellectual Property Office, the disclosure of which is incorporated by reference herein in its entirety.

BACKGROUND

1. Field

Embodiments of the present disclosure relate to a semiconductor package, and more particularly, to a semiconductor package including a wire.

2. Description of the Related Art

As the electronics industry advances rapidly and the demands of users increases, electronic devices are being more and more miniaturized and light, and thus, semiconductor chips, which are essential parts of electronic devices, need to be highly integrated. Also, as mobile products advance, the need for miniaturized and multifunctional semiconductor chips used in electronic devices is also increasing. Therefore, semiconductor packages having a package on package (POP), where an upper package is stacked on one lower package having a different function, have been proposed.

SUMMARY

Embodiments of the present disclosure include a semiconductor package which may dissipate heat occurring in an internal semiconductor chip of the semiconductor package.

According to embodiments of the present disclosure, a semiconductor package is provided. The semiconductor package includes: a first semiconductor chip; a lower redistribution structure electrically connected to the first semiconductor chip; an upper redistribution structure on the first semiconductor chip; a conductive post electrically connecting the upper redistribution structure to the lower redistribution structure; and at least one first wire connecting a lower surface of the first semiconductor chip to an upper surface of the lower redistribution structure such as to be configured to dissipate heat of the first semiconductor chip.

According to embodiments of the present disclosure, a semiconductor package is provided. The semiconductor package includes: a first semiconductor chip; a lower redistribution structure electrically connected to the first semiconductor chip; an upper redistribution structure on the first semiconductor chip; a conductive post electrically connecting the upper redistribution structure to the lower redistribution structure; at least one first wire connecting a lower surface of the first semiconductor chip to an upper surface of the lower redistribution structure such as to be configured to dissipate heat of the first semiconductor chip; and at least one second wire connecting the upper surface of the lower redistribution structure to a lower surface of the upper redistribution structure.

According to embodiments of the present disclosure, a semiconductor package is provided. The semiconductor package includes: a first semiconductor chip; a lower redistribution structure electrically connected to the first semiconductor chip; an upper redistribution structure on the first semiconductor chip; a conductive post electrically connecting the upper redistribution structure to the lower redistribution structure; a second semiconductor chip on an upper surface of the upper redistribution structure and electrically connected to a redistribution layer of the semiconductor package; at least one first wire connecting a lower surface of the first semiconductor chip with an upper surface of the lower redistribution structure such as to be configured to dissipate heat of the first semiconductor chip; and at least one second wire connecting the upper surface of the lower redistribution structure to a lower surface of the upper redistribution structure, wherein at least a portion of the at least one second wire electrically connects the upper surface of the lower redistribution structure to the lower surface of the upper redistribution structure, and wherein a total number of the at least one first wire is equal to a total number of the at least one second wire.

Aspects of the present disclosure are not limited to the aforesaid, and other aspects not described herein will be clearly understood by those of ordinary skill in the art from descriptions below.

BRIEF DESCRIPTION OF DRAWINGS

Embodiments will be more clearly understood from the following detailed description taken in conjunction with the accompanying drawings in which.

DETAILED DESCRIPTION

Figure 1A:
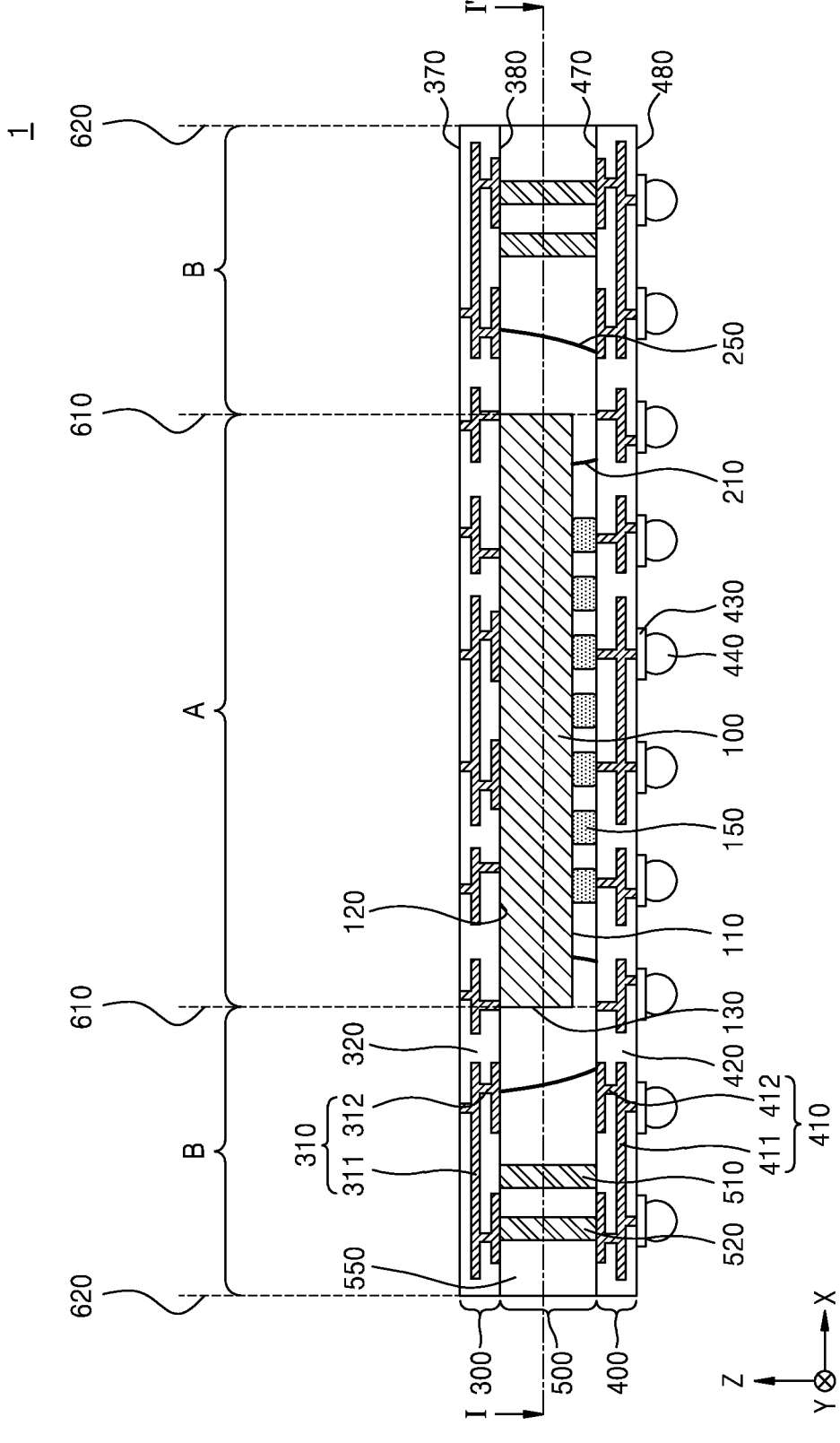
FIG. 1A is a side cross-sectional view illustrating a semiconductor package according to embodiments.

Hereinafter, various non-limiting example embodiments of the present disclosure will be described in detail with reference to the accompanying drawings. Like reference numerals refer to like elements in the drawings, and their repeated descriptions are omitted.

It will be understood that when an element or layer is referred to as being "over," "above," "on," "below,"

"under," "beneath," "connected to" or "coupled to" another element or layer, it can be directly over, above, on, below, under, beneath, connected or coupled to the other element or layer or intervening elements or layers may be present. In contrast, when an element or layer is referred to as being "directly over," "directly above," "directly on," "directly below," "directly under," "directly beneath," "directly connected to" or "directly coupled to" another element or layer, there are no intervening elements or layers present.

FIG. 1A is a side cross-sectional view illustrating a semiconductor package 1 according to embodiments.

Referring to FIG. 1A, the semiconductor package 1 may include a first semiconductor chip 100, an upper redistribution structure 300, a lower redistribution structure 400, a plurality of conductive posts 510 and 520, and a molding layer 550.

The semiconductor package 1 may be a fan out semiconductor package where a footprint of the lower redistribution structure 400 is greater than a footprint of the first semiconductor chip 100. That is, a horizontal width and a horizontal area of the lower redistribution structure 400 may respectively be greater than a horizontal width and a horizontal area of the first semiconductor chip 100.

The lower redistribution structure 400 may include a lower redistribution pattern 410 and a plurality of lower redistribution insulation layers 420 covering the lower redistribution pattern 410. The plurality of lower redistribution insulation layers 420 may be mutually stacked in a vertical direction (a Z-axis direction). The plurality of lower redistribution insulation layers 420 may be formed from a material film including an organic compound. For example, the plurality of lower redistribution insulation layers 420 may be formed from a photo imageable dielectric (PID), an ajinomoto build-up film (ABF), or a photosensitive polyimide (PSPI).

The lower redistribution pattern 410 may include a plurality of lower redistribution line patterns 411, disposed on at least one of upper surfaces and lower surfaces of the plurality of lower redistribution insulation layers 420, and a plurality of lower redistribution via patterns 412 which extend through at least one of the plurality of lower redistribution insulation layers 420. The plurality of lower redistribution via patterns 412 may electrically connect the plurality of lower redistribution line patterns 411 arranged at different levels in the vertical direction (the Z-axis direction). For example, the lower redistribution pattern 410 may include metal, such as copper (Cu), aluminum (Al), tungsten (W), titanium (Ti), tantalum (Ta), indium (In), molybdenum (Mo), manganese (Mn), cobalt (Co), zinc (Sn), nickel (Ni), magnesium (Mg), rhenium (Re), beryllium (Be), gallium (Ga), or ruthenium (Ru), or an alloy thereof, but is not limited thereto.

Some of the plurality of lower redistribution line patterns 411 may be provided at an upper surface 470 of the lower redistribution structure 400 and may configure a conductive pad (not shown) connected to a conductive bump 150 attached on the first semiconductor chip 100 and a conductive pad (not shown) connected to the conductive posts 510 and 520. Also, some of the plurality of lower redistribution line patterns 411 may be provided at a lower surface of the lower redistribution structure 400 and may configure an external connection pad 430 connected to an external connection terminal 440. The external connection terminal 440 may be, for example, a solder ball or a solder bump.

At least some of the plurality of lower redistribution line patterns 411 may be provided as one body with some of the plurality of lower redistribution via patterns 412. For example, some of the plurality of lower redistribution line patterns 411 may be provided as one body with the plurality of lower redistribution via patterns 412 respectively contacting lower surfaces thereof.

In embodiments, each of the plurality of lower redistribution via patterns 412 may have a tapered shape where a horizontal width thereof narrows progressively in a direction from an upper side thereof to a lower side thereof. That is, a horizontal width of each of the plurality of lower redistribution via patterns 412 may narrow progressively in a direction distancing from the upper surface 470 of the lower redistribution structure 400 facing the first semiconductor chip 100.

In embodiments, a thickness of the lower redistribution structure 400 in the vertical direction (the Z-axis direction) may be within a range of about 30 μm to about 100 μm.

The lower redistribution structure 400 may use a redistribution substrate or a printed circuit board (PCB) formed by using a redistribution process.

The first semiconductor chip 100 may be disposed on the upper surface 470 of the lower redistribution structure 400. For example, a conductive bump 150, such as a micro bump, may be disposed on a lower surface 110 of the first semiconductor chip 100 and may be mounted on the lower redistribution structure 400 by a flip chip scheme.

In embodiments, the first semiconductor chip 100 may include a memory chip. For example, the first semiconductor chip 100 may include a volatile memory chip and/or a non-volatile memory chip. The volatile memory chip may include, for example, dynamic random access memory (RAM) (DRAM), high bandwidth memory (HBM) DRAM, static RAM (SRAM), thyristor RAM (TRAM), zero capacitor RAM (ZRAM), or twin transistor RAM (TTRAM). Also, the non-volatile memory chip may include, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or insulator resistance change memory.

In embodiments, the first semiconductor chip 100 may include a logic chip. For example, the first semiconductor chip 100 may include a central processing unit (CPU), a graphics processing unit (GPU), or an application processor (AP).

In embodiments, the first semiconductor chip 100 may be a communication chip and may include a signal processing circuit for processing a wireless signal. For example, the first semiconductor chip 100 may include a radio frequency integrated circuit (RFIC).

In FIG. 1A, the semiconductor package 1 is illustrated as including one semiconductor chip, but is not limited thereto. For example, two or more semiconductor chips apart from one another in a horizontal direction may be disposed on the lower redistribution structure 400. The two or more semiconductor chips may be the same kind of chips, or may be different kinds of chips.

The molding layer 550 may be disposed on the lower redistribution structure 400 and may cover at least a portion of the first semiconductor chip 100. For example, the molding layer 550 may extend along a side surface 130 of the first semiconductor chip 100. In embodiments, the molding layer 550 may include an insulation polymer or epoxy resin. For example, the molding layer 550 may include an epoxy mold compound (EMC). In embodiments, an upper surface of the molding layer 550 may be arranged at the same level as a level of an upper surface 120 of the first semiconductor chip 100.

The conductive posts 510 and 520 may be arranged apart from a sidewall of the first semiconductor chip 100 in the horizontal direction (an X-axis direction and/or a Y-axis direction). The conductive posts 510 and 520 may each be a through mold via which passes through the molding layer 550 and extends in the vertical direction (the Z-axis direction). The conductive posts 510 and 520 may include, for example, copper (Cu).

Each of the conductive posts 510 and 520 may be a vertical connection conductor for electrically connecting the lower redistribution pattern 410 of the lower redistribution structure 400 to an upper redistribution pattern 310 of the upper redistribution structure 300. A lower end portion of each of the conductive posts 510 and 520 may be connected to at least a portion of the lower redistribution pattern 410 provided at the upper surface 470 of the lower redistribution structure 400, and an upper end portion of each of the conductive posts 510 and 520 may be connected to at least a portion of the lower redistribution pattern 410 provided at a lower surface of the upper redistribution structure 300. A level of the upper end of each of the conductive posts 520 and 530 in the vertical direction (the Z-axis direction) may be higher than or equal to the upper surface 120 of the first semiconductor chip 100.

The upper redistribution structure 300 may include the upper redistribution pattern 310 and a plurality of upper redistribution insulation layers 320 covering the upper redistribution pattern 310.

The upper redistribution structure 300 may be formed to cover the upper surface 120 of the first semiconductor chip 100 and an upper surface of the molding layer 550. A horizontal width and a horizontal area of the upper redistribution structure 300 may respectively be greater than the horizontal width and the horizontal area of the first semiconductor chip 100. In embodiments, a footprint of the upper redistribution structure 300 may be the same as a footprint of the lower redistribution structure 400. The footprint of the upper redistribution structure 300 and the footprint of the lower redistribution structure 400 may be the same as a footprint of the semiconductor package 1.

The plurality of upper redistribution insulation layers 320 may be mutually stacked in the vertical direction (the Z-axis direction). The plurality of upper redistribution insulation layers 320 may be formed from a material film including an organic compound. For example, each of the plurality of upper redistribution insulation layers 320 may be formed from a PID, an ABF, or a PSPI.

The upper redistribution pattern 310 may include a plurality of upper redistribution line patterns 311, disposed on at least one of upper surfaces and lower surfaces of the plurality of upper redistribution insulation layers 320, and a plurality of upper redistribution via patterns 312 which extend through at least one of the plurality of upper redistribution insulation layers 320. The plurality of upper redistribution via patterns 312 may electrically connect the plurality of upper redistribution line patterns 311 arranged at different levels in the vertical direction (the Z-axis direction). For example, the upper redistribution pattern 310 may include metal, such as Cu, Al, W, Ti, Ta, In, Mo, Mn, Co, Sn, Ni, Mg, Re, Be, Ga, or Ru, or an alloy thereof, but is not limited thereto.

Some of the plurality of upper redistribution line patterns 311 may be provided at a lower surface 380 of the upper redistribution structure 300 and may configure a connection pad (not shown) connected to an upper end of each of the conductive posts 510 and 520.

At least some of the plurality of upper redistribution line patterns 311 may be provided as one body with some of the plurality of upper redistribution via patterns 312. For example, some of the plurality of upper redistribution line patterns 311 may be provided as one body with the plurality of upper redistribution via patterns 312 respectively contacting lower surfaces thereof.

In embodiments, each of the plurality of upper redistribution via patterns 312 may have a tapered shape where a horizontal width thereof narrows progressively in a direction from an upper side thereof to a lower side thereof. That is, a horizontal width of each of the plurality of upper redistribution via patterns 312 may narrow progressively in a direction distancing from an upper surface 370 of the upper redistribution structure 300.

In embodiments, a thickness of the upper redistribution structure 300 in the vertical direction (the Z-axis direction) may be within a range of about 10 μm to about 100 μm.

A signal between the first semiconductor chip 100 and an external device outside the semiconductor package 1 may be transferred through an electrical path including the external connection terminal 440, the lower redistribution pattern 410 of the lower redistribution structure 400, the conductive posts 510 and 520, and the upper redistribution pattern 310 of the upper redistribution structure 300. Alternatively, the signal between the first semiconductor chip 100 and the external device outside the semiconductor package 1 may be transferred through an electrical path including the external connection terminal 440, the lower redistribution pattern 410 of the lower redistribution structure 400, and the conductive bump 150.

For example, a power/ground signal or an input/output (I/O) data signal may be transferred between the external device and an individual element of the first semiconductor chip 100 through the electrical path including the external connection terminal 440, the lower redistribution pattern 410 of the lower redistribution structure 400, and the conductive bump 150. For example, the power/ground signal or the I/O data signal may be transferred between the external device and the individual element of the first semiconductor chip 100 through the electrical path including the external connection terminal 440, the lower redistribution pattern 410 of the lower redistribution structure 400, and the conductive bump 150.

For example, when the first semiconductor chip 100 is a communication chip configured to transfer a wireless signal, an antenna pattern for transferring or receiving the wireless signal may be provided in the first semiconductor chip 100. In this case, a signal may be transferred through an electrical path including the first semiconductor chip 100, the conductive bump 150, the lower redistribution pattern 410 of the lower redistribution structure 400, the conductive posts 510 and 520, the upper redistribution pattern 310 of the upper redistribution structure 300, and the antenna pattern of the first semiconductor chip 100.

The semiconductor package 1 may include a first wire 210. The first wire 210 may connect the lower surface 110 of the first semiconductor chip 100 with the upper surface 470 of the lower redistribution structure 400. In an embodiment, the first wire 210 may connect the lower surface 110 of the first semiconductor chip 100 with the upper surface 470 of the lower redistribution structure 400 with a slope in a direction from the lower surface 110 of the first semiconductor chip 100 to the outside with respect to the first semiconductor chip 100. According to embodiments, a plurality of the first wire 210 may be provided and adjacent ones of the plurality of the first wire may be spaced apart at a uniform interval.

The first wire 210 may include a material which is high in thermal conductivity. In an embodiment, the first wire 210 may include one or more metals of gold (Au), silver (Ag), and Cu. However, embodiments of the present disclosure are not limited thereto, and the first wire 210 may include a material other than metal.

Heat occurring due to an operation of the first semiconductor chip 100 may be transferred to peripheral semiconductor devices. The transfer of heat may be performed by conduction. In an embodiment, heat occurring in the first semiconductor chip 100 may be transferred through the molding layer 550, the upper redistribution structure 300, the conductive bump 150, and the lower redistribution structure 400. Heat occurring in the first semiconductor chip 100 may be transferred through the first wire 210 connected to the lower surface of the first semiconductor chip 100. Heat transferred to the first wire 210 may be transferred along the first wire 210 to an end portion instead of another portion connected to the first semiconductor chip 100. The first wire 210 may be connected to the upper surface 470 of the lower redistribution structure 400. Heat transferred along the first wire 210 may be transferred to the lower redistribution structure 400. The molding layer 550 or an adhesive layer (not shown) surrounding the first semiconductor chip 100 may be lower in thermal conductivity than a material included in the first wire 210. Heat occurring in the first semiconductor chip 100 may be transferred to the lower redistribution structure 400 through the molding layer 550, the adhesive layer, and the conductive bump 150. The first wire 210, as described above, may be higher in thermal conductivity than the molding layer 550 or the adhesive layer. Therefore, the first wire 210 may effectively dissipate heat occurring in the first semiconductor chip 100. Heat dissipated from the first semiconductor chip 100 may be mainly transferred to the lower redistribution structure 400 by the first wire 210. The first wire 210 may be surrounded by the molding layer 550 or the adhesive layer (not shown). Heat transferred from the first semiconductor chip 100 to the first wire 210 may be transferred from the first wire 210 to a material surrounding the first wire 210. In an embodiment, heat transferred from the first semiconductor chip 100 to the first wire 210 may be transferred from the first wire 210 to the molding layer 550 and the adhesive layer.

The semiconductor package 1 may include a second wire 250. The second wire 250 may connect a lower surface 380 of the upper redistribution structure 300 with the upper surface 470 of the lower redistribution structure 400. In an embodiment, the second wire 250 may connect the lower surface 380 of the upper redistribution structure 300 with the upper surface 470 of the lower redistribution structure 400 with a slope in a direction from the lower surface 380 of the upper redistribution structure 300 to an inner portion thereof with respect to the first semiconductor chip 100. A plurality of the second wire 250 may be provided and adjacent ones of the plurality of the second wire 250 may be spaced apart from each other at a uniform interval.

The second wire 250 may include a material which is high in thermal conductivity. In an embodiment, the second wire 250 may include one or more metals of Au, Ag, and Cu. However, embodiments of the present disclosure are not limited thereto, and the second wire 250 may include a material other than metal.

As described above, heat occurring due to an operation of the first semiconductor chip 100 may be transferred to peripheral semiconductor devices. The transfer of heat may be performed by conduction. In an embodiment, heat occurring in the first semiconductor chip 100 may be transferred through the molding layer 550, the upper redistribution structure 300, the conductive bump 150, and the lower redistribution structure 400.

The second wire 250 may transfer heat between the upper redistribution structure 300 and the lower redistribution structure 400. In an embodiment, the upper redistribution structure 300 may contact the upper surface 120 of the first semiconductor chip 100. In this case, most of heat occurring in the first semiconductor chip 100 may be transferred to the upper redistribution structure 300. A temperature of the upper redistribution structure 300 may be set to be higher than that of the lower redistribution structure 400. The second wire 250 may transfer heat from the upper redistribution structure 300 to the lower redistribution structure 400.

In other embodiments, the upper redistribution structure 300 may not directly contact the upper surface 120 of the first semiconductor chip 100. In this case, heat occurring in the first semiconductor chip 100 may be mainly transferred to materials surrounding the conductive bump 150 and the first semiconductor chip 100. A temperature of the lower redistribution structure 400 may be set to be higher than a temperature of the upper redistribution structure 300. The second wire 250 may transfer heat from the lower redistribution structure 400 to the upper redistribution structure 300.

The second wire 250 may transfer heat of the upper redistribution structure 300 to the lower redistribution structure 400, or may transfer heat from the lower redistribution structure 400 to the upper redistribution structure 300. The second wire 250 may transfer heat of the upper redistribution structure 300 or heat of the lower redistribution structure 400 to a material surrounding the second wire 250, or may transfer heat in a direction opposite thereto. In an embodiment, the second wire 250 may transfer heat, transferred from the upper redistribution structure 300, to the molding layer 550 surrounding a periphery of the second wire 250. Alternatively, heat may be transferred through the second wire 250 in a direction opposite thereto.

At least a portion of the second wire 250 may electrically connect the upper redistribution structure 300 with the lower redistribution structure 400. In an embodiment, at least a portion of the second wire 250 may electrically connect the upper redistribution pattern 310 of the upper redistribution structure 300 with the lower redistribution pattern 410 of the lower redistribution structure 400. The second wire 250 may include a conductive material. Therefore, at least a portion of the second wire 250 may simultaneously perform functions for heat transfer and an electrical connection.

The first wire 210 and the second wire 250 may be bonded or connected to the upper redistribution structure 300, the lower redistribution structure 400, and the first semiconductor chip 100 by using a stitch bonding scheme or a ball bonding scheme, but are not limited thereto.

Heat occurring in the first semiconductor chip 100 may be distributed to peripheral semiconductor devices through the first wire 210 and the second wire 250, and thus, heat of the semiconductor package 1 may be effectively dissipated. Simultaneously, at least a portion of the second wire 250 may electrically connect the upper redistribution structure 300 with the lower redistribution structure 400.

Figure 1B:
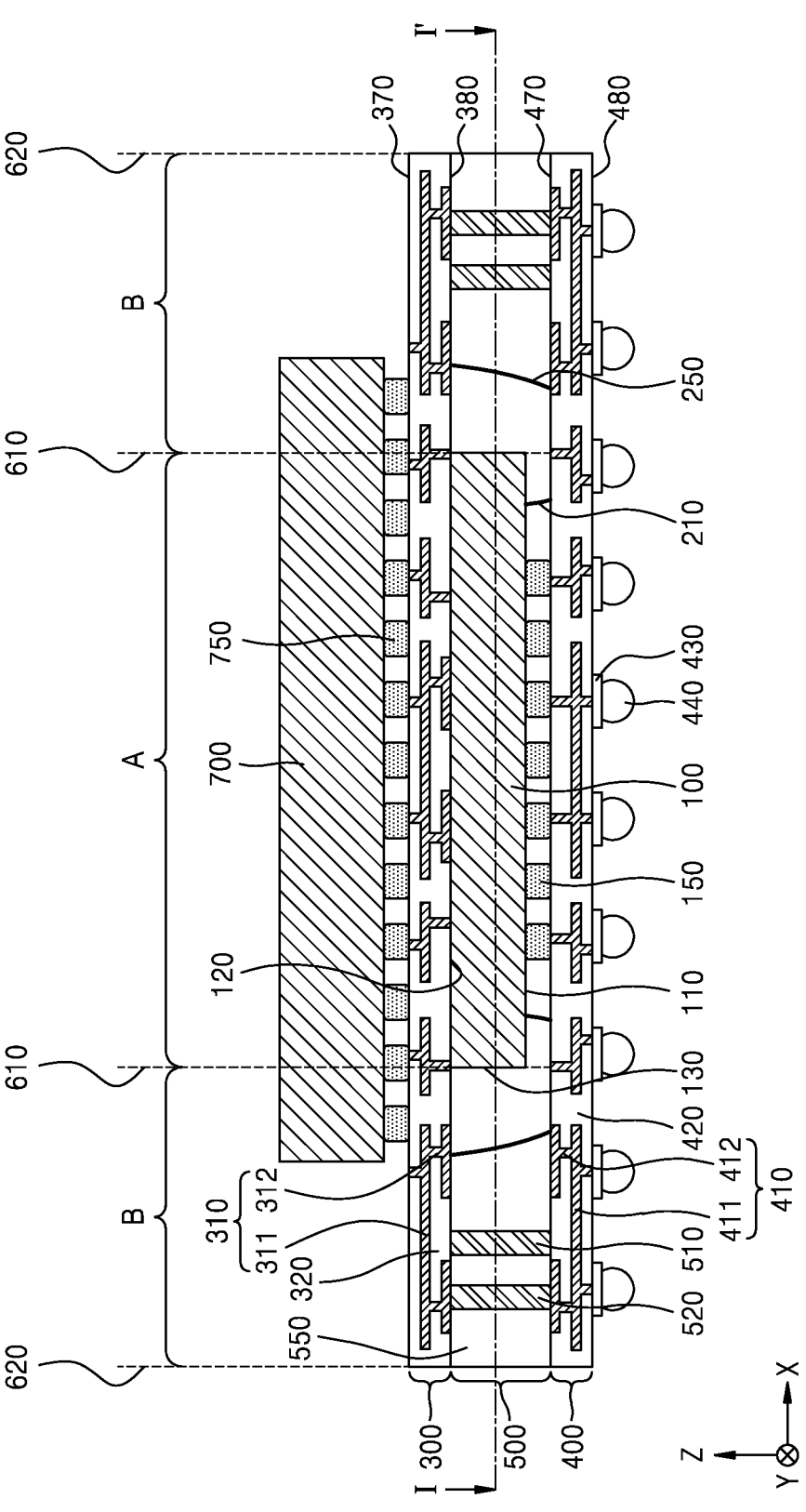
FIG. 1B is a side cross-sectional view illustrating a semiconductor package according to embodiments.

FIG. 1B is a cross-sectional view illustrating a semiconductor package having a package on package (POP) type, according to embodiments. In describing FIG. 1B, descriptions which are the same as or similar to the descriptions of FIG. 1A may be omitted.

Referring to FIG. 1B, the semiconductor package according to embodiments may be a semiconductor package of a PoP type where an upper package is attached on a lower package.

The lower package may be the semiconductor package 1 illustrated in FIG. 1A. A semiconductor package 1 (e.g., a lower semiconductor package) may include a first semiconductor chip 100 within a first semiconductor chip region 500, and a lower redistribution structure 400 and an upper redistribution structure 300 each covering the first semiconductor chip 100.

An upper package or a second semiconductor chip 700 may be mounted on the upper redistribution structure 300. The upper package may include the second semiconductor chip 700.

In embodiments, the second semiconductor chip 700 may be mounted on the upper redistribution structure 300. In this case, the second semiconductor chip 700 may be electrically connected to the upper redistribution structure 300 through a conductive bump 750.

The second semiconductor chip 700 may include a memory chip, a logic chip, a system on chip (SoC), a power management integrated circuit (PMIC) chip, and an RFIC chip. The memory chip may include a DRAM chip, an SRAM chip, an MRAM chip, a NAND flash memory chip, and/or an HBM chip. The logic chip may include an AP, a microprocessor, a CPU, and/or an application specific integrated circuit (ASIC). For example, the SoC may include at least two of a logic circuit, a memory circuit, a digital integrated circuit (IC), an RFIC, and an I/O circuit.

In embodiments, the first semiconductor chip 100 may be a semiconductor chip where an amount of heat that occurs thereat is higher than an amount of heat that occurs at the second semiconductor chip 700. In embodiments, the first semiconductor chip 100 may include a logic chip and/or an SoC. In embodiments, the second semiconductor chip 700 may include a PMIC chip and/or an RFIC chip.

Figure 1C:
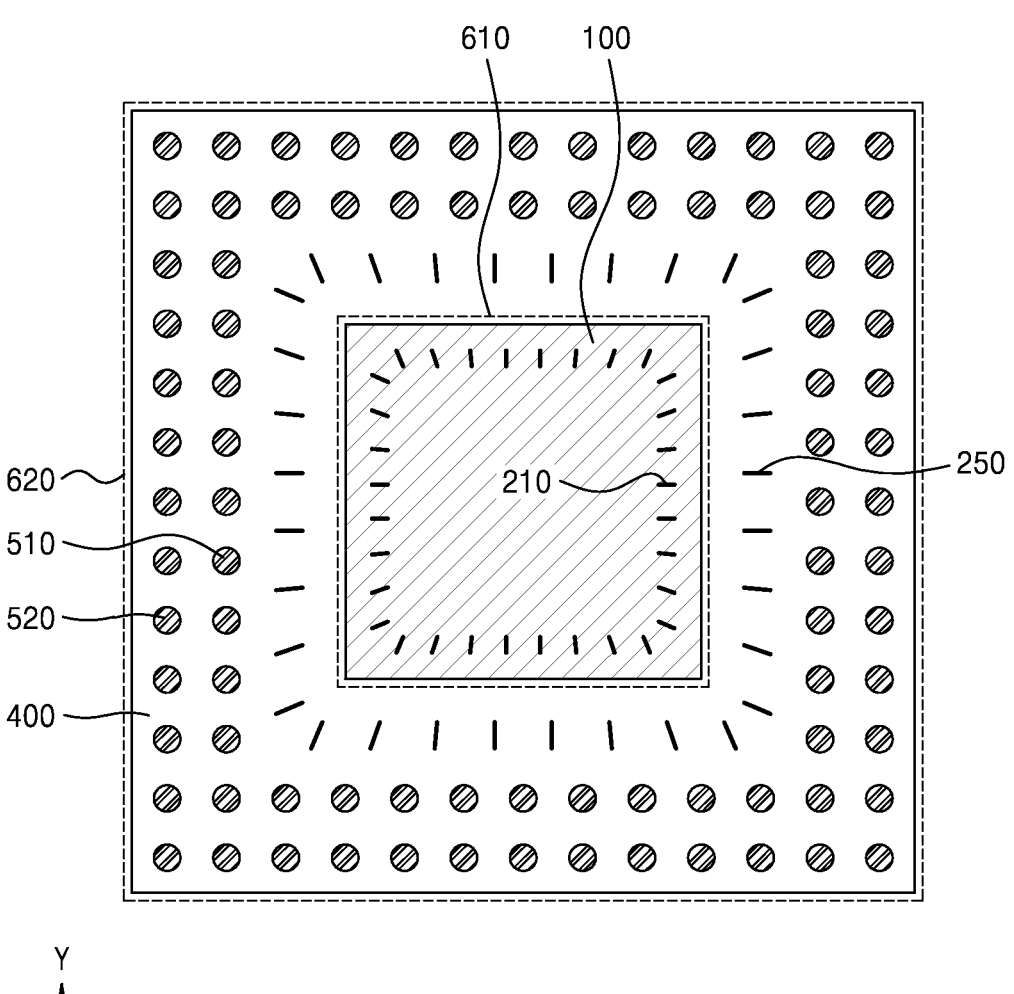
FIG. 1C is a plan view illustrating a semiconductor package according to embodiments.
Figure 1C:
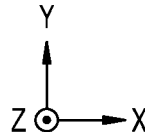

FIG. 1C is a plan view illustrating a semiconductor package when a cross-sectional surface taken along line I-I' in the embodiment of FIG. 1A is seen in a −Z-axis direction.

Referring to FIG. 1C, a first semiconductor chip 100 may be mounted on an upper surface of a lower redistribution structure 400, and conductive posts 510 and 520 may be disposed at a peripheral portion of the lower redistribution structure 400. A surface, where the first semiconductor chip 100 overlaps the lower redistribution structure 400, of the lower redistribution structure 400 may be referred to as a first surface A (refer to FIG. 1A). The first surface A may be divided by a first boundary 610 (refer to FIG. 1A). The first boundary 610 may denote a boundary where the first semiconductor chip 100 overlaps the lower redistribution structure 400. A first wire 210 may connect a lower surface of the first semiconductor chip 100 with the first surface A of the lower redistribution structure 400. A surface, where the first semiconductor chip 100 does not overlap the lower redistribution structure 400, of the lower redistribution structure 400, may be referred to as a second surface B (refer to FIG. 1A). That is, a portion, other than the first surface A, of the surface of the lower redistribution structure 400 may be referred to as a second surface B. The second surface B may be differentiated from the first surface A by the first boundary 610. The second surface B may be a surface of the lower redistribution structure 400 between the first boundary 610 and a second boundary 620. The second boundary 620 may denote a boundary where the upper redistribution structure 300 overlaps the lower redistribution structure 400. A second wire 250 may connect a lower surface 380, where the conductive posts 510 and 520 are not disposed, of the upper redistribution structure 300 with a second surface B, where the conductive posts 510 and 520 are not disposed, of an upper surface 470 of the upper redistribution structure 300.

In an embodiment, the number of the first wire 210 and the number of the second wire 250 may be equal to the number of wires disposed in the semiconductor package 1. Due to a method of manufacturing the semiconductor package 1, described below, the first wire 210 and the second wire 250 may correspond to each other, and moreover, the number of the first wire 210 may be equal to the number of the second wire 250. As in FIG. 1C, when an X-Y plane is seen in a −Z-axis direction, a direction facing the first wire 210 may be almost similar to a direction facing the second wire 250 corresponding thereto. Accordingly, a shape of each of the first wire 210 and the second wire 250 may be implemented as a radial shape with respect to the first semiconductor chip 100.

Figure 1D:
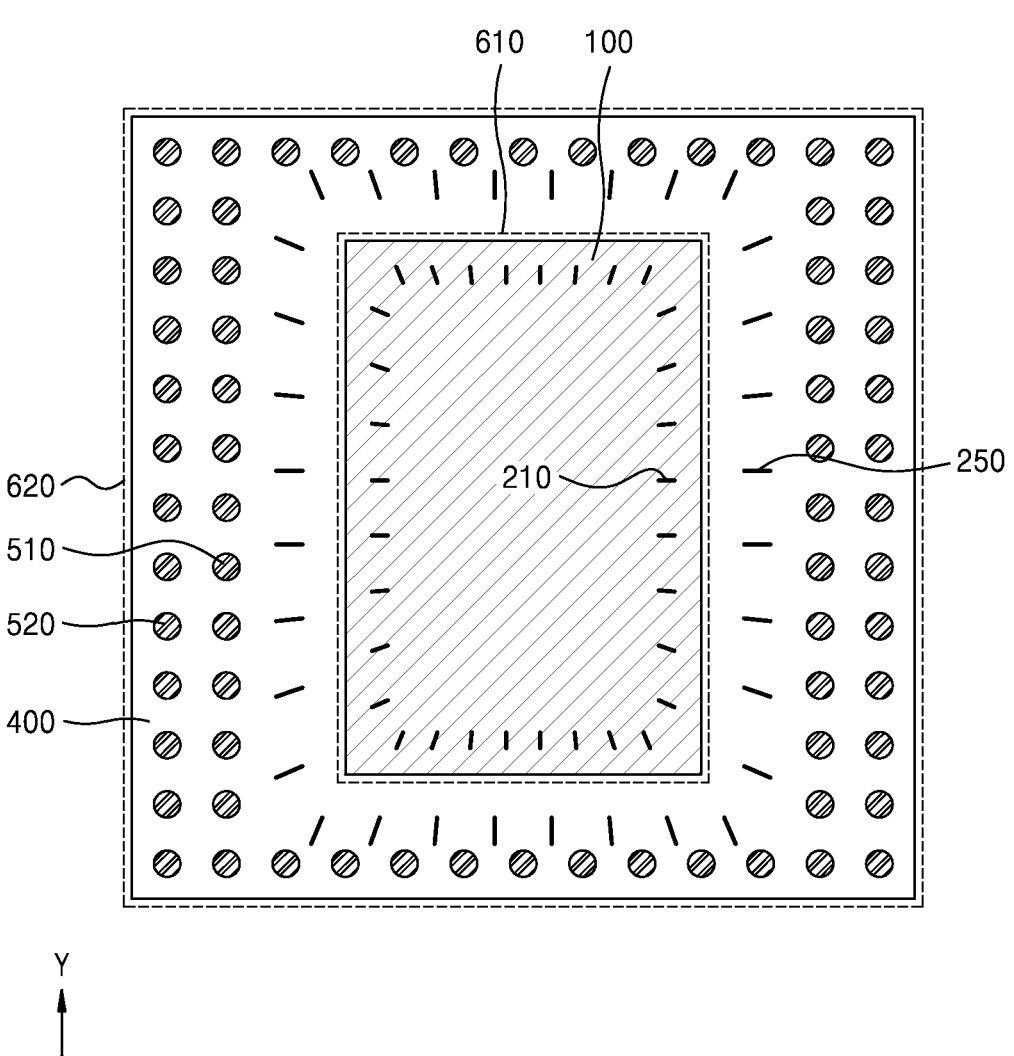
FIG. 1D is a plan view illustrating a semiconductor package according to embodiments.
Figure 1D:
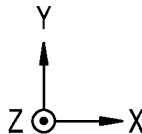

FIG. 1D is a plan view illustrating a semiconductor package when a cross-sectional surface taken along line I-I' in the embodiment of FIG. 1A is seen in a −Z-axis direction.

Referring to FIG. 1D, a first semiconductor chip 100 may have a tetragonal shape. In an embodiment, the first semiconductor chip 100 may have a square shape where a length thereof in an X-axis direction is the same as a length thereof in a Y-axis direction as in FIG. 1C. Alternatively, as in FIG. 1D, the first semiconductor chip 100 may have a rectangular shape where one of a length thereof in an X-axis direction and a length thereof in a Y-axis direction is greater than the other length. However, a shape of the first semiconductor chip 100 is not limited thereto.

Figure 2A:
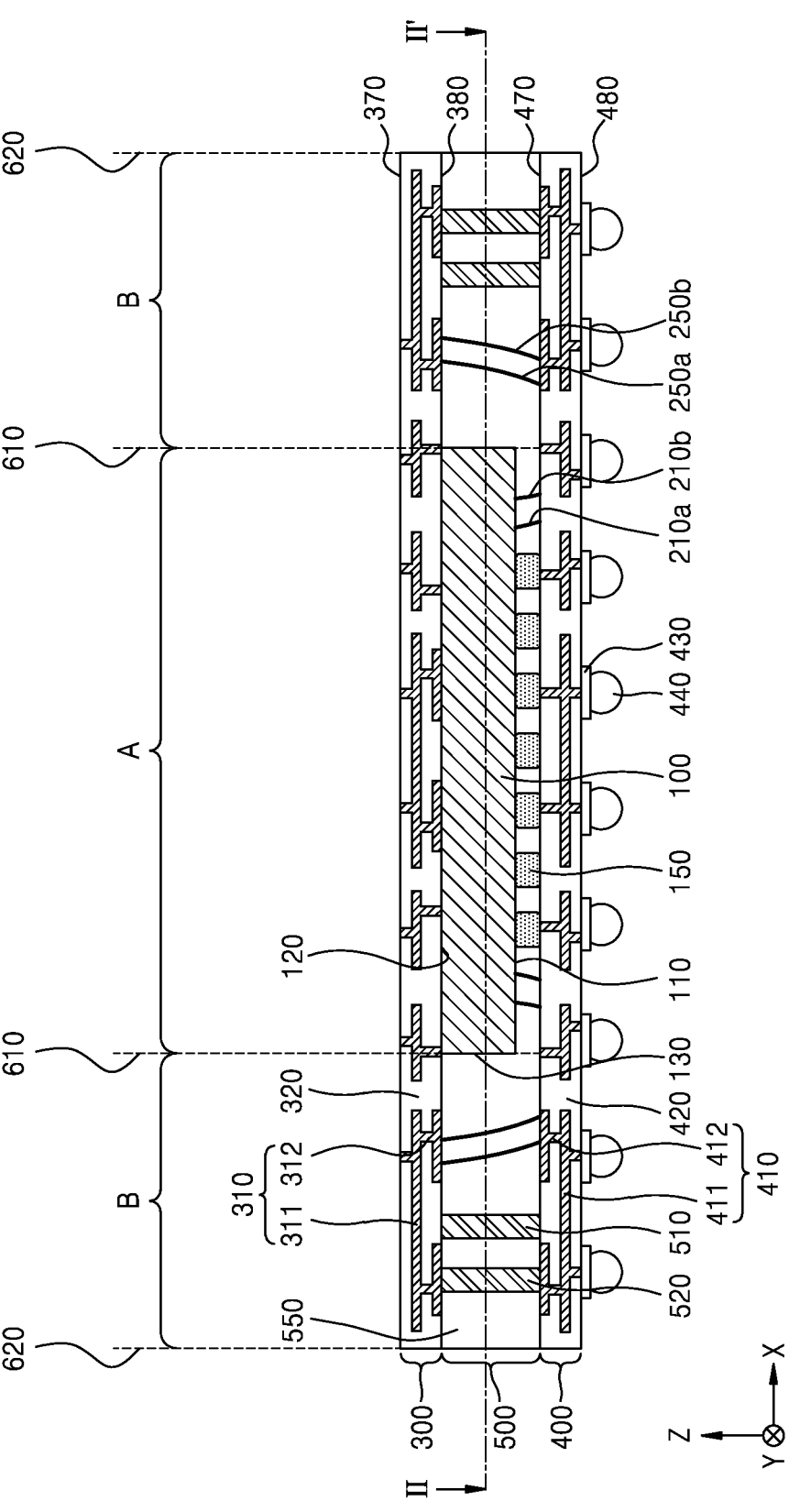
FIG. 2A is a side cross-sectional view illustrating a semiconductor package according to embodiments.

FIG. 2A is a side cross-sectional view illustrating a semiconductor package according to embodiments.

Referring to FIG. 2A, a first wire 210 may include an inner first wire 210a and an outer first wire 210b. The inner first wire 210a may be disposed closer than the outer first wire 210b to a first semiconductor chip 100.

The inner first wire 210a and the outer first wire 210b may connect the lower surface 110 of the first semiconductor chip 100 with the upper surface 470 of the lower redistribution structure 400. In an embodiment, the inner first wire 210a and the outer first wire 210b may connect the lower surface 110 of the first semiconductor chip 100 with the upper surface 470 of the lower redistribution structure 400 with a slope in a direction from the lower surface 110 of the first semiconductor chip 100 to the outside with respect to the first semiconductor chip 100. The inner first wire 210a and the outer first wire 210b may include a material with high thermal conductivity. Hereinafter, descriptions of the inner first wire 210a and the outer first wire 210b are omitted within a range overlapping the above descriptions.

Heat occurring in the first semiconductor chip 100 may be transferred through the inner first wire 210a and the outer first wire 210b. Hereinafter, descriptions of heat transfer by the inner first wire 210a and the outer first wire 210b are omitted within a range overlapping heat transfer by the first wire 210 described above.

The second wire 250 may include an inner second wire 250a and an outer second wire 250b. The inner second wire 250a may be disposed closer than the outer second wire 250b to the first semiconductor chip 100.

The inner second wire 250a and the outer second wire 250b may connect the lower surface 380 of the upper redistribution structure 300 with the upper surface 470 of the lower redistribution structure 400. In an embodiment, the inner second wire 250a and the outer second wire 250b may connect the lower surface 380 of the upper redistribution structure 300 with the upper surface 470 of the lower redistribution structure 400 with a slope in a direction from the lower surface 380 of the upper redistribution structure 300 to an inner portion thereof with respect to the first semiconductor chip 100. The inner second wire 250a and the outer second wire 250b may include a material which is high in thermal conductivity. Hereinafter, descriptions of the inner second wire 250a and the outer second wire 250b are omitted within a range overlapping the above descriptions.

As described above, heat occurring due to an operation of the first semiconductor chip 100 may be transferred to peripheral semiconductor devices. The transfer of heat may be performed by conduction. In an embodiment, heat occurring in the first semiconductor chip 100 may be transferred through the molding layer 550, the upper redistribution structure 300, the conductive bump 150, and the lower redistribution structure 400. The inner second wire 250a and the outer second wire 250b may transfer heat between the upper redistribution structure 300, the lower redistribution structure 400, and the molding layer 550. Hereinafter, descriptions of heat transfer by the inner second wire 250a and the outer second wire 250b are omitted within a range overlapping heat transfer by the second wire 250 described above.

Figure 2B:
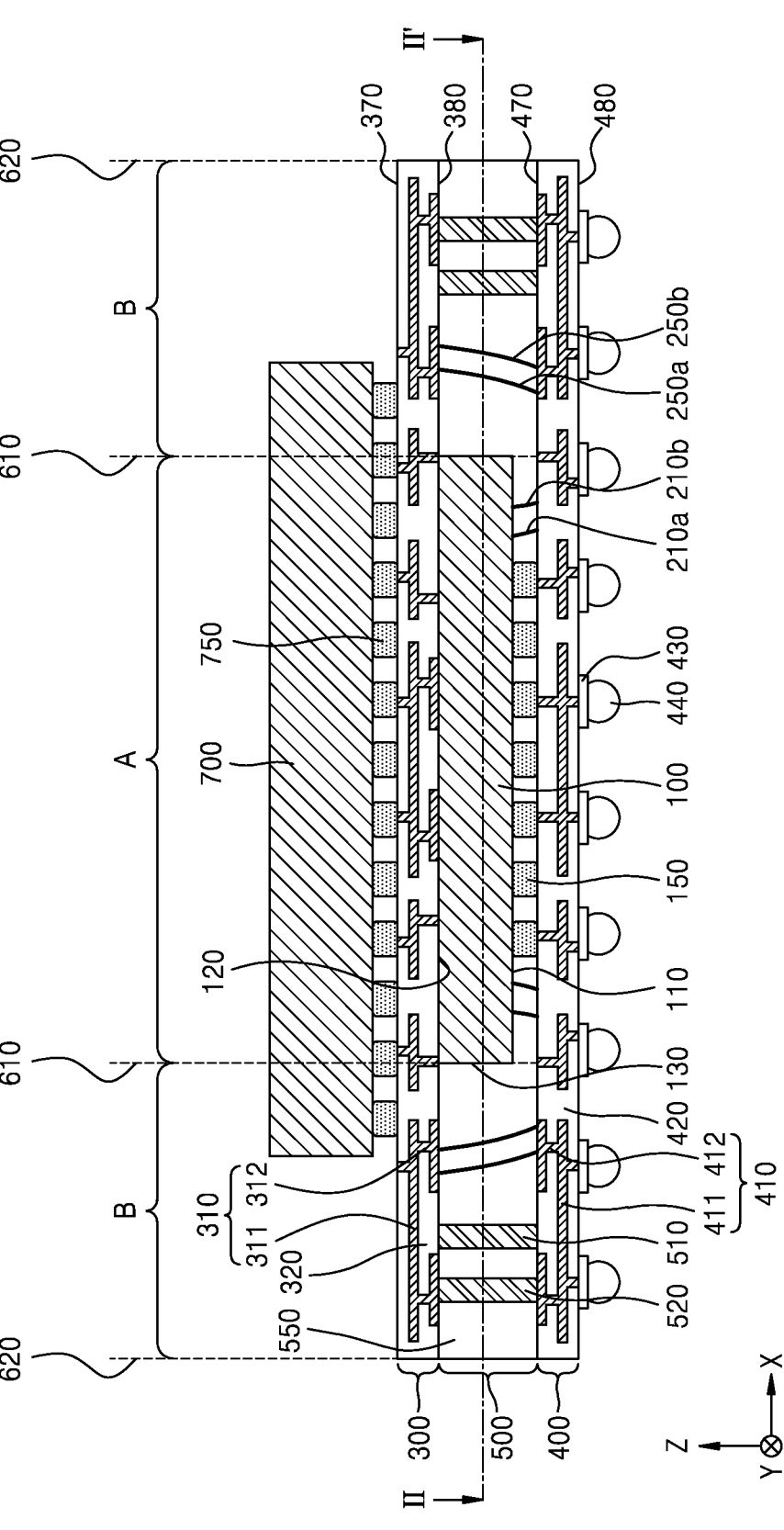
FIG. 2B is a side cross-sectional view illustrating a semiconductor package according to embodiments.

FIG. 2B is a side cross-sectional view illustrating a semiconductor package according to embodiments.

Referring to FIG. 2B, the semiconductor package according to embodiments may be a semiconductor package of a PoP type where an upper package is attached on a lower package. In describing FIG. 2B, descriptions which are same as or similar to the descriptions of FIG. 2A may be omitted.

The lower package may be the semiconductor package 1 illustrated in FIG. 2A. Like the semiconductor package of FIG. 2A, the semiconductor package of FIG. 2B may include the inner first wire 210a, the outer first wire 210b, the inner second wire 250a, and the outer second wire 250b. The upper package or a second semiconductor chip 700 may be mounted on the upper redistribution structure 300. The upper package may include the second semiconductor chip 700.

The lower package may be the semiconductor package 1 illustrated in FIG. 2A. The semiconductor package 1 may include the first semiconductor chip 100 in a first semiconductor chip region 500, and the lower redistribution structure 400 and the upper redistribution structure 300 each covering the first semiconductor chip 100.

The upper package or the second semiconductor chip 700 may be mounted on the upper redistribution structure 300. The upper package may include the second semiconductor chip 700.

In embodiments, the second semiconductor chip 700 may be mounted on the upper redistribution structure 300. In this case, the second semiconductor chip 700 may be electrically connected to the upper redistribution structure 300 through the conductive bump 750. In the following descriptions, descriptions which are the same as or similar to the above descriptions are omitted.

Figure 2C:
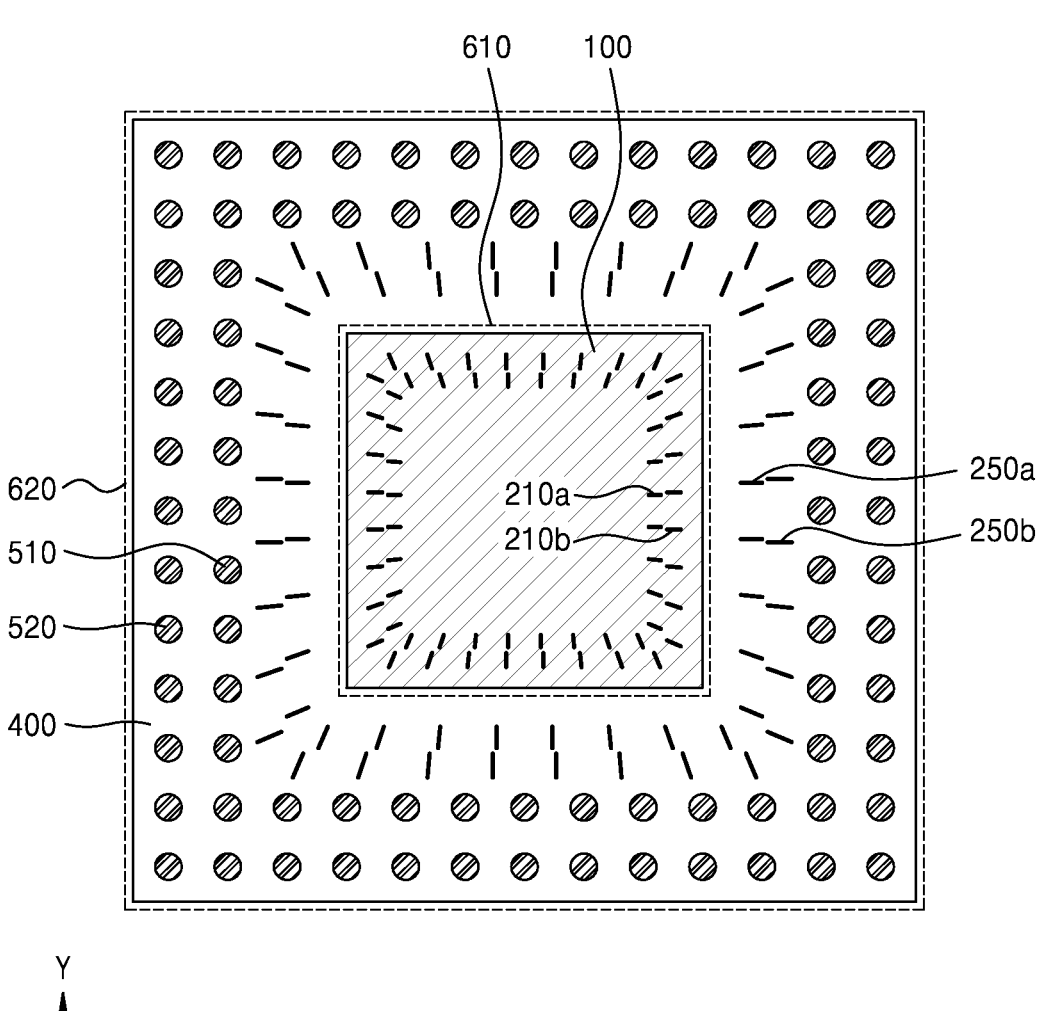
FIG. 2C is a plan view illustrating a semiconductor package according to embodiments.

FIG. 2C is a plan view illustrating a semiconductor package when a cross-sectional surface taken along line II-II' in the embodiment of FIG. 2A is seen in a −Z-axis direction.

Referring to FIG. 2C, a first semiconductor chip 100 may be mounted on an upper surface of the lower redistribution structure 400, and conductive posts 510 and 520 may be disposed at a peripheral portion of the lower redistribution structure 400. A surface, where the first semiconductor chip 100 overlaps the lower redistribution structure 400, of the lower redistribution structure 400 may be referred to as a first surface A (refer to FIG. 2A). An inner first wire 210a and an outer first wire 210b may connect a lower surface of the first semiconductor chip 100 with a first surface A of the lower redistribution structure 400. A surface, where the first semiconductor chip 100 does not overlap the lower redistribution structure 400, of the lower redistribution structure 400 may be referred to as a second surface B. That is, a portion, other than the first surface A, of the surface of the lower redistribution structure 400 may be referred to as a second surface B (refer to FIG. 2A). The inner second wire 250a and the outer second wire 250b may connect the lower surface 380, where the conductive posts 510 and 520 are not disposed, of the upper redistribution structure 300 with a second surface B, where the conductive posts 510 and 520 are not disposed, of the upper surface 470 of the upper redistribution structure 300.

In an embodiment, the number of the inner first wire 210a, the outer first wire 210b, the inner second wire 250a, and the outer second wire 250b may be equal to the number of wires provided in the semiconductor package. Due to a method of manufacturing the semiconductor package, described below, the inner first wire 210a and the outer second wire 250b may correspond to each other. Also, the outer first wire 210b and the inner second wire 250a may correspond to each other. The number of the inner first wire 210a and the outer first wire 210b may be equal to the number of the inner second wire 250a and the outer second wire 250b. As in FIG. 1C, when an X-Y plane is seen in a −Z-axis direction, a direction facing the inner first wire 210a may be similar to a direction facing the outer second wire 250b corresponding thereto. Also, a direction facing the outer first wire 210b may be similar to a direction facing the inner second wire 250a corresponding thereto. Therefore, a shape of each of the inner first wire 210a, the outer first wire 210b, the inner second wire 250a, and the outer second wire 250b may be implemented as a radial shape with respect to the first semiconductor chip 100.

Figure 3:
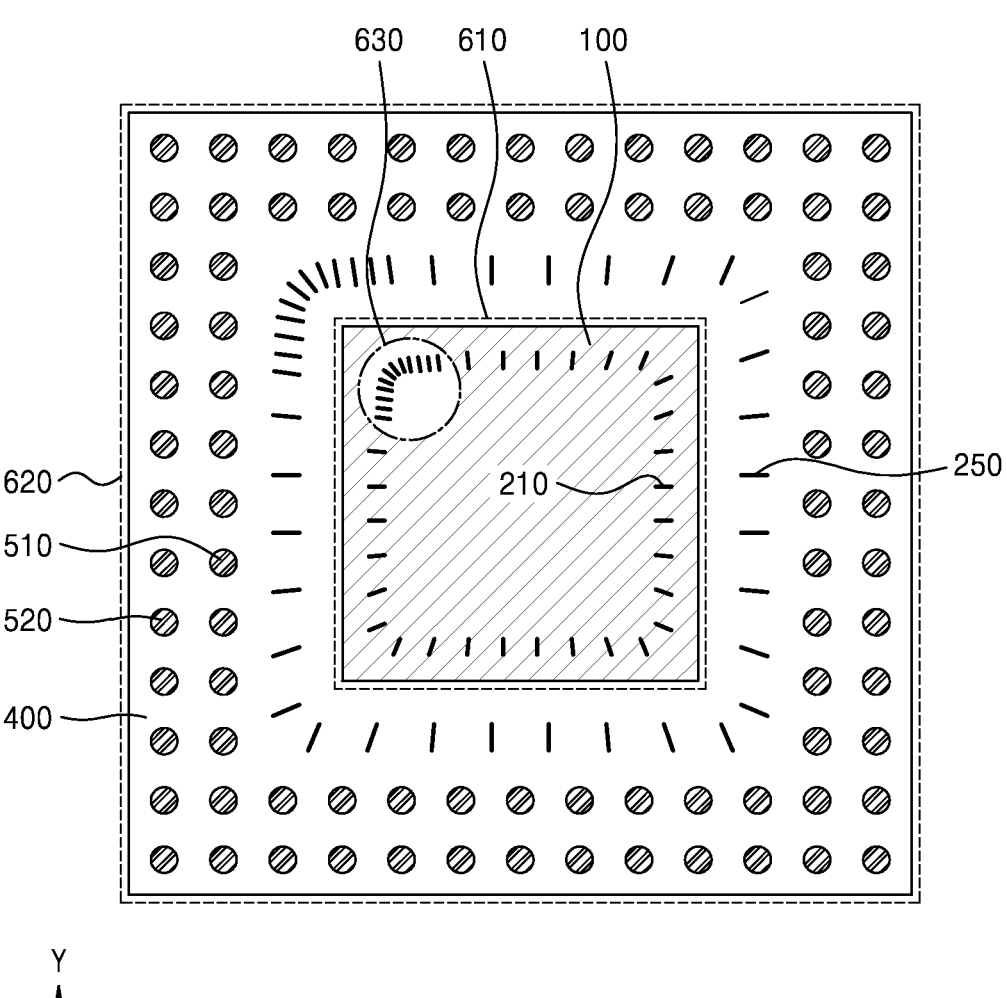
FIG. 3 is a plan view illustrating a semiconductor package according to embodiments.

FIG. 3 is a plan view illustrating a semiconductor package according to embodiments.

Referring to FIG. 3, at least a portion of the first wire 210 may be connected to a third surface 630 which is a portion of a lower surface of the first semiconductor chip 100. A density of the first wire 210 connected to the third surface 630 may be greater than a density of the first wire 210 connected to a portion of the lower surface of the first semiconductor chip 100 other than the third surface 630. In this specification, the third surface 630 may be referred to as a first region, and the portion of the lower surface of the first semiconductor chip 100 other than the third surface 630 may be referred to as a second region. In an embodiment, the third surface 630 may be a surface of a portion, where high heat occurs, of the first semiconductor chip 100. Based on the configuration and arrangement of internal semiconductor devices of the first semiconductor chip 100, high heat may occur in a peripheral portion of a surface of the first semiconductor chip 100 when the first semiconductor chip 100 is operating. In this case, heat of the first semiconductor chip 100 may be more effectively dissipated than a case where the first wire 210 is disposed on a surface of a portion where high heat occurs.

Figure 4:
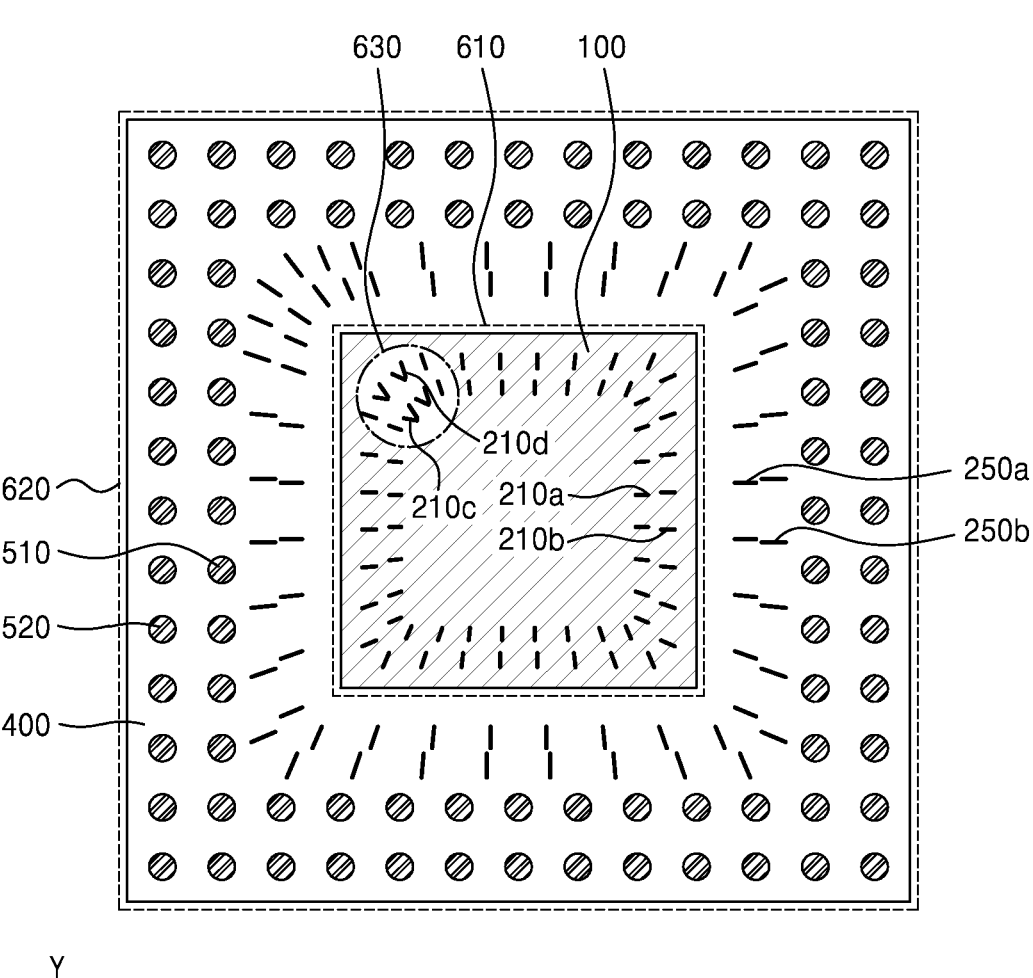
FIG. 4 is a plan view illustrating a semiconductor package according to embodiments.
Figure 4:
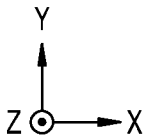

FIG. 4 is a plan view illustrating a semiconductor package according to embodiments.

Referring to FIG. 4, the first wire 210 may be connected to the third surface 630 which is a portion of the lower surface of the first semiconductor chip 100. Paired adjacent ones of the first wire 210 connected to the third surface 630 may be provided and may be connected to the first semiconductor chip 100. The first wire 210 may include an inner first wire 210c and an outer first wire 210d. Paired adjacent ones of the inner first wire 210c may be provided and may be connected to the first semiconductor chip 100. Paired adjacent ones of the outer first wire 210d may be provided and may be connected to the first semiconductor chip 100. A density of the inner first wire 210c and the outer first wire 210d each connected to the third surface 630 may be greater than a density of the inner first wire 210c and the outer first wire 210d each connected to a portion of the lower surface of the first semiconductor chip 100 other than the third surface 630. In an embodiment, the third surface 630 may be a surface of a portion, where high heat occurs, of the first semiconductor chip 100. Based on the configuration and arrangement of internal semiconductor devices of the first semiconductor chip 100, high heat may occur in a peripheral portion of a surface of the first semiconductor chip 100 when the first semiconductor chip 100 is operating. In this case, heat of the first semiconductor chip 100 may be more effectively dissipated than a case where the first wire 210 is disposed on a surface of a portion where high heat occurs.

Figure 5A:
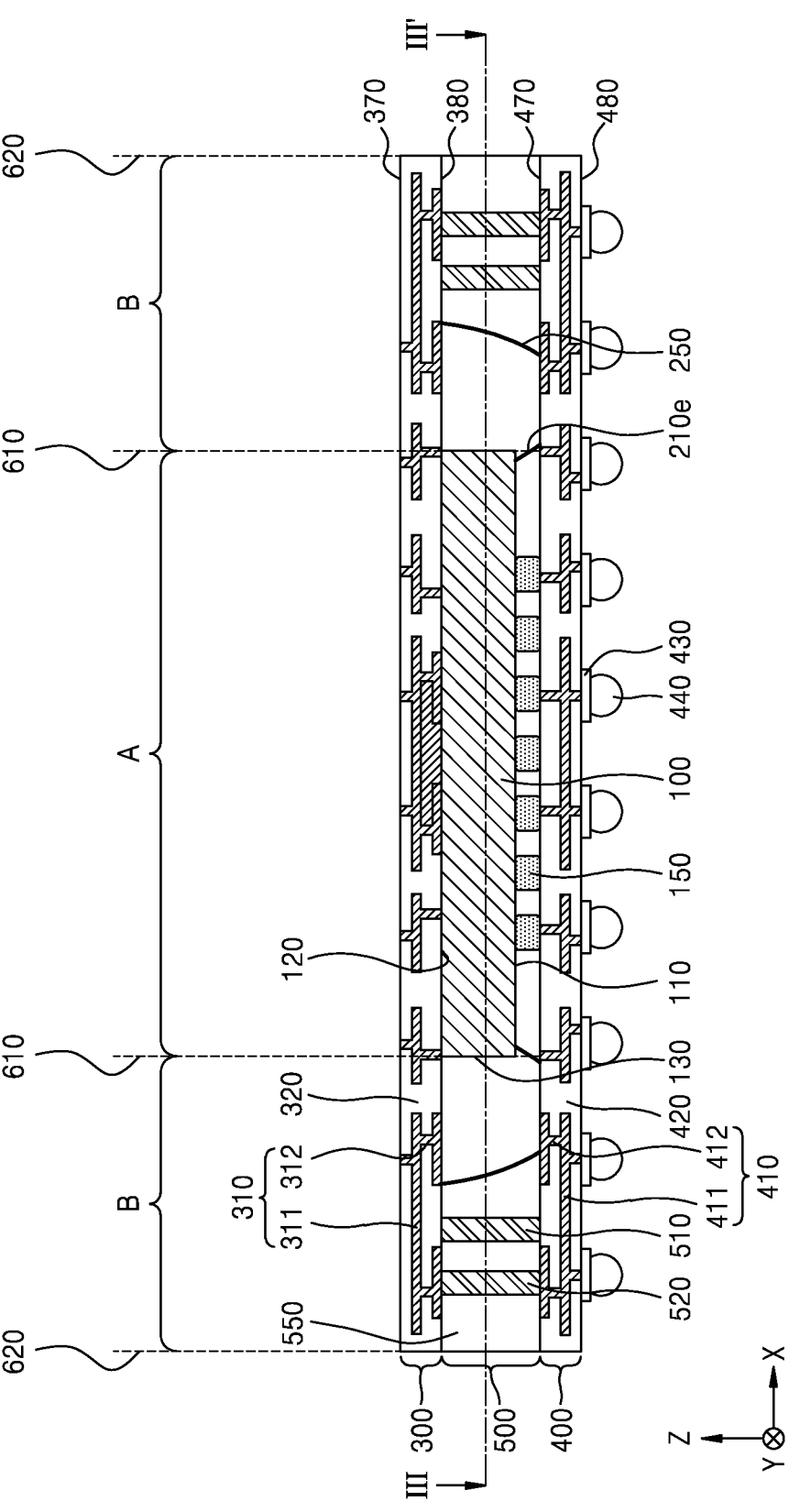
FIG. 5A is a side cross-sectional view illustrating a semiconductor package according to embodiments.
Figure 5B:
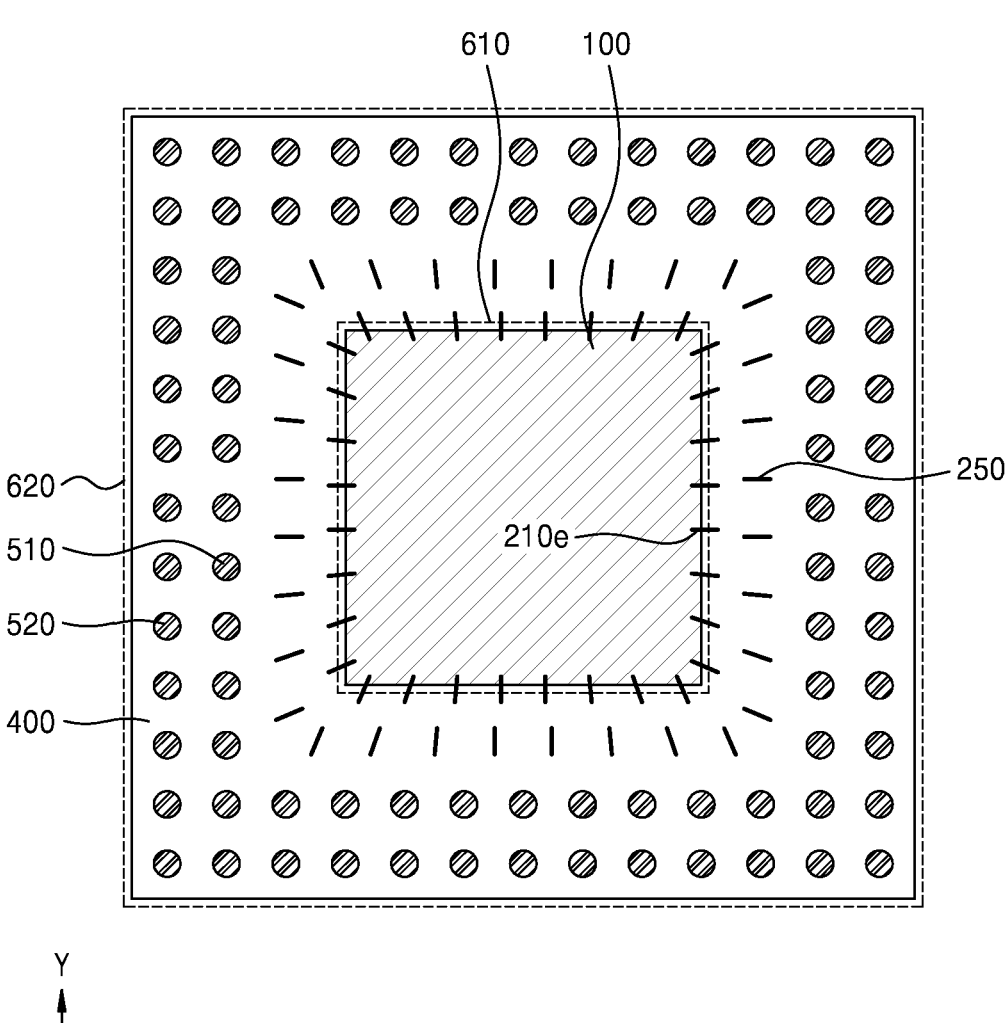
FIG. 5B is a plan view illustrating a semiconductor package according to embodiments.

FIG. 5A is a plan view illustrating a semiconductor package according to embodiments. FIG. 5B is a plan view illustrating a semiconductor package when a cross-sectional surface taken along line III-III' of the semiconductor package of FIG. 5A in one of embodiments is seen in a −Z-axis direction.

Referring to FIGS. 5A and 5B, as described above, a surface, where the first semiconductor chip 100 overlaps the lower redistribution structure 400, of the lower redistribution structure 400 may be referred to as a first surface A. A surface, where the first semiconductor chip 100 does not overlap the lower redistribution structure 400, of the lower redistribution structure 400 may be referred to as a second surface B. That is, a portion, other than the first surface A, of the surface of the lower redistribution structure 400 may be referred to as a second surface B. A first wire 210e may connect the lower surface 110 of the first semiconductor chip 100 with the second surface B of the upper surface 470 of the lower redistribution structure 400. The second wire 250 may connect the lower surface 380 of the upper redistribution structure 300 with the second surface B of the upper surface 470 of the lower redistribution structure 400. Because the lower redistribution structure 400 disposed under the first semiconductor chip 100 is relatively close to the first semiconductor chip 100 in distance, a portion of the upper surface 470, overlapped by the first semiconductor chip 100, of the lower redistribution structure 400 may be higher in temperature than a portion, which is not overlapped by the first semiconductor chip 100, of the lower redistribution structure 400. In this case, when the first wire 210e is connected to the second surface B, heat of the first semiconductor chip 100 may be more effectively dissipated.

Figure 6A:
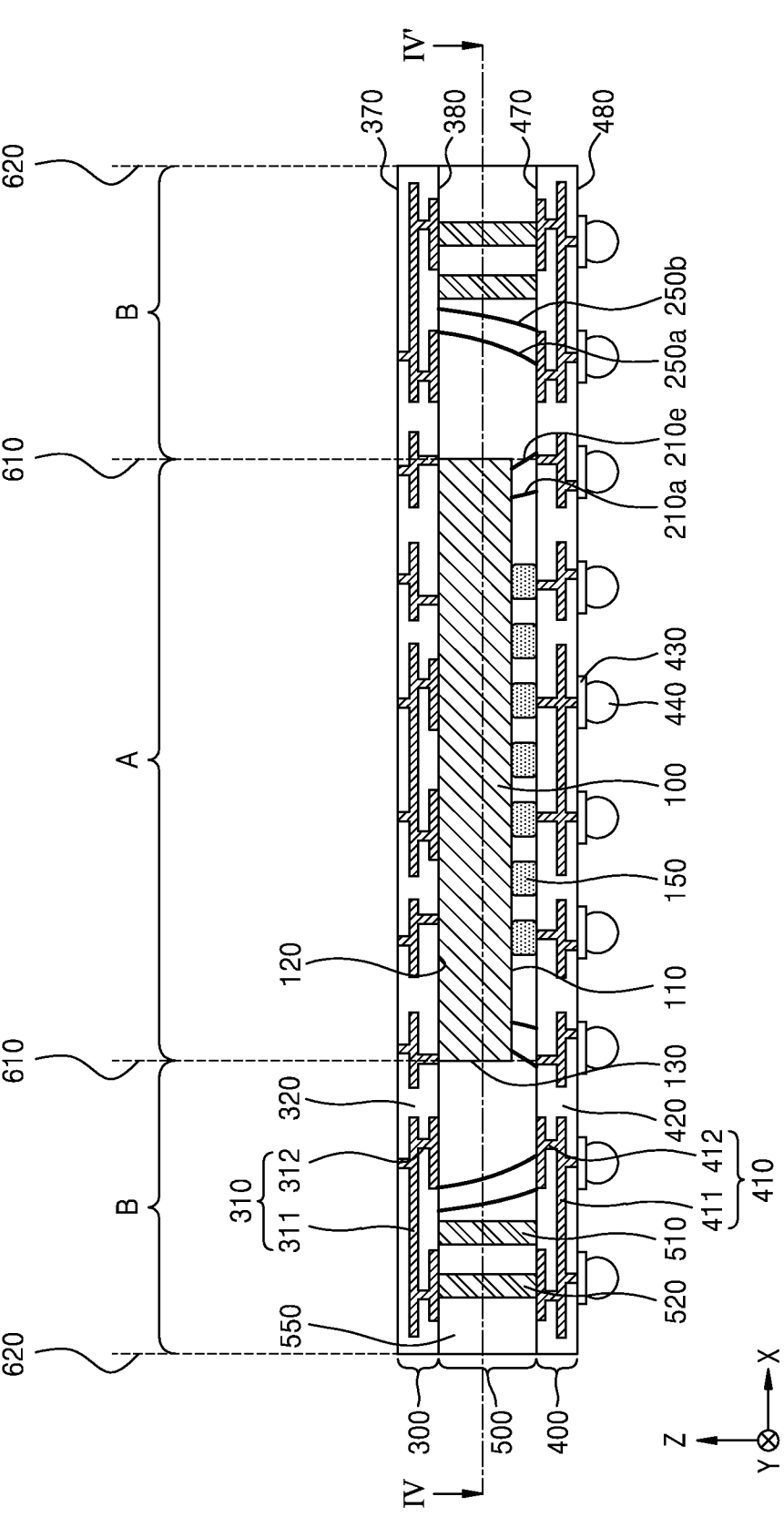
FIG. 6A is a plan view illustrating a semiconductor package according to embodiments.
Figure 6B:
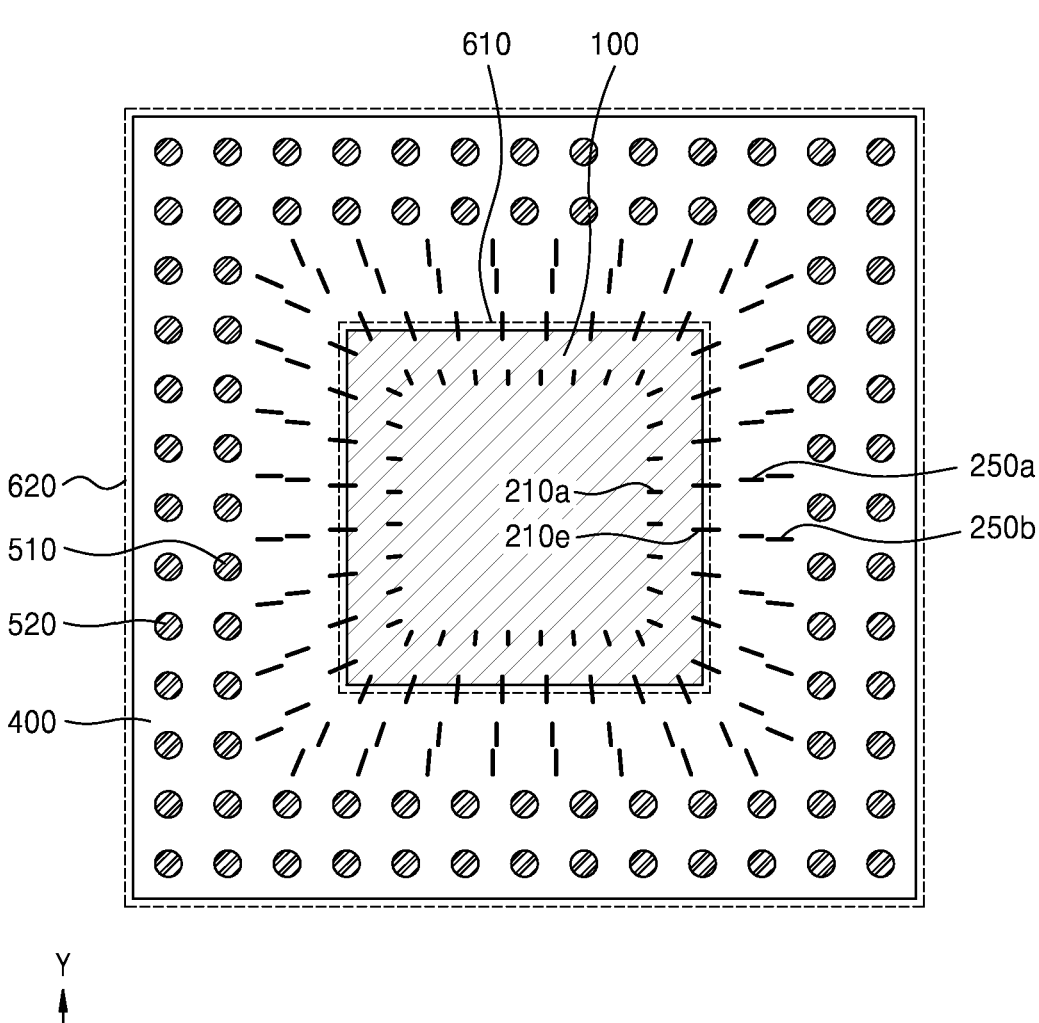
FIG. 6B is a plan view illustrating a semiconductor package according to embodiments.

FIG. 6A is a plan view illustrating a semiconductor package according to embodiments. FIG. 6B is a plan view illustrating a semiconductor package when a cross-sectional surface taken along line IV-IV' of the semiconductor package of FIG. 6A in one of embodiments is seen in a −Z-axis direction. In describing FIGS. 6A and 6B, descriptions which are the same as or similar to the descriptions of FIGS. 5A and 5B are omitted.

Referring to FIGS. 6A and 6B, The first wire 210 may include the inner first wire 210a and the first wire 210e. The second wire 250 may include the inner second wire 250a and the outer second wire 250b. In an embodiment, the first wire 210e may connect the lower surface 110 of the first semiconductor chip 100 with a second surface B of an upper surface 470 of the lower redistribution structure 400. With respect to the first wire 210 and the second wire 250, descriptions which are the same as or similar to the above descriptions are omitted.

FIGS. 7A to 7G are side cross-sectional views illustrating a method of manufacturing a semiconductor package, according to embodiments. Hereinafter, a method of manufacturing the semiconductor package 1 illustrated in FIG. 1A will be described with reference to FIGS. 7A to 7G.

Figure 7A:
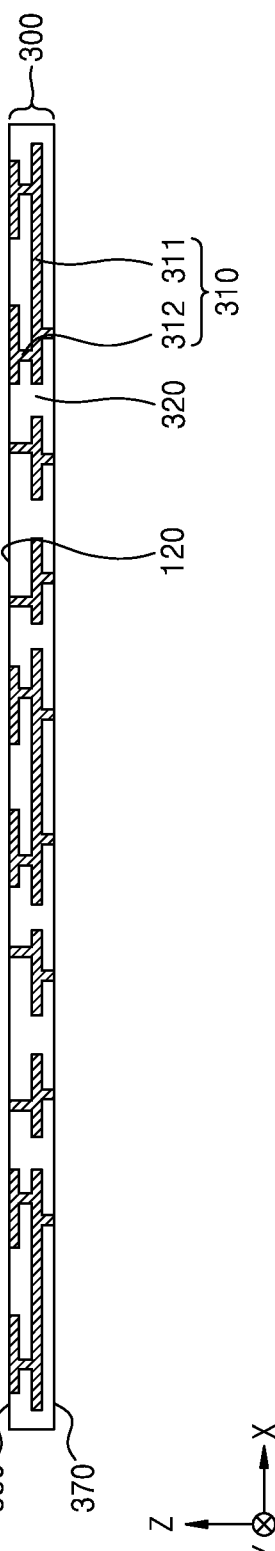
FIGS. 7A to 7H are side cross-sectional views illustrating a method of manufacturing a semiconductor package, according to embodiments.

Referring to FIG. 7A, an upper redistribution structure 300 may be formed on a carrier substrate (not shown). The carrier substrate may include a second adhesive material layer, such as a release film, on one surface thereof. The upper redistribution structure 300 may include a plurality of upper redistribution insulation layers 320 sequentially stacked on the carrier substrate, and an upper redistribution pattern 310 insulated by the plurality of upper redistribution insulation layers 320. In order to form the upper redistribution structure 300, a first operation of forming a conductive material film on the carrier substrate and patterning the conductive material film to form a first-layer of upper redistribution line patterns 311, a second operation of covering the first-layer of the upper redistribution line patterns 311 and forming at least one of the upper redistribution insulation layers 320 including a via hole, and a third operation of forming at least one of upper redistribution via patterns 312 filling the via hole of the at least one of upper redistribution insulation layers 320 and another one or more of the upper redistribution line patterns 311 extending along an upper surface of the at least one of the upper redistribution insulation layers 320, and then, the second and third operations may be performed a plurality of times.

Figure 7B:
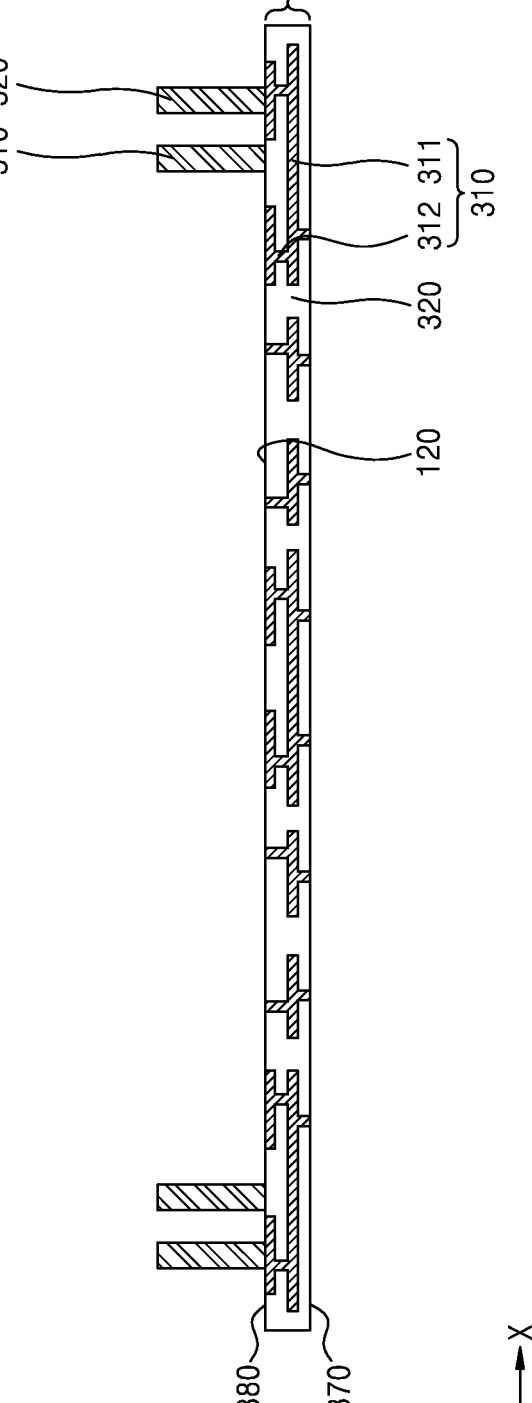

Referring to FIG. 7B, conductive posts 510 and 520 may be formed on the upper redistribution structure 300.

Figure 7C:
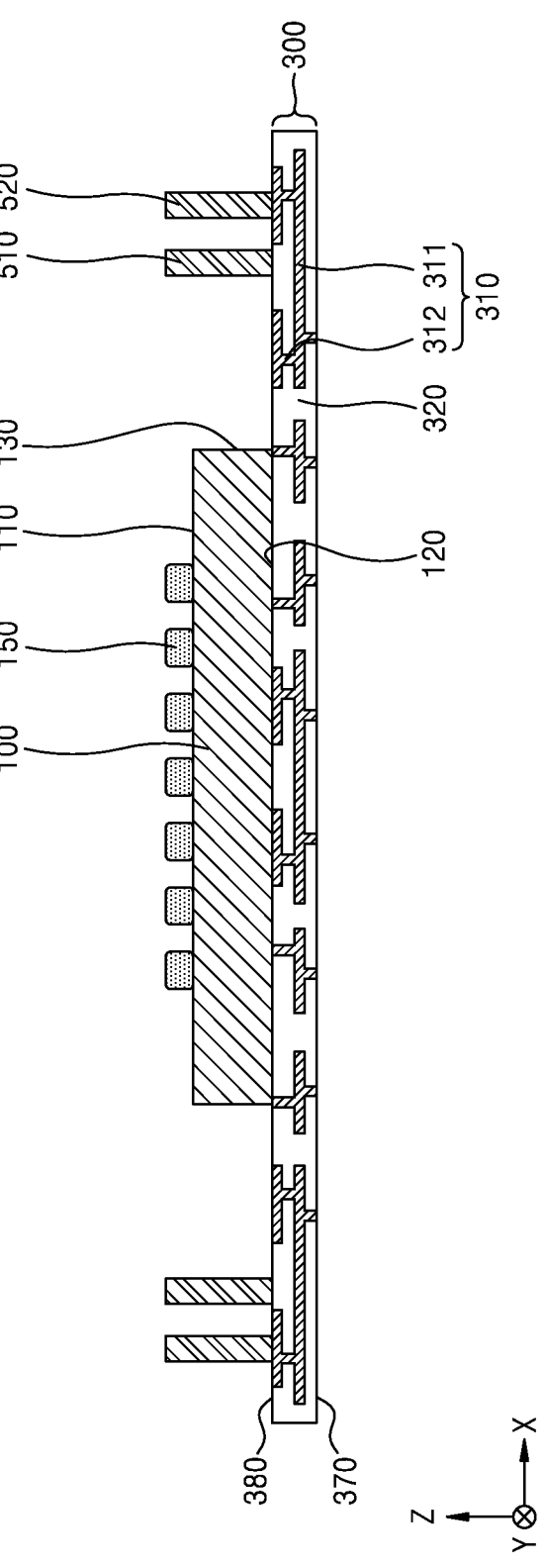

Referring to FIG. 7C, a first semiconductor chip 100 may be disposed on a lower surface 380 of the upper redistribution structure 300.

Figure 7D:
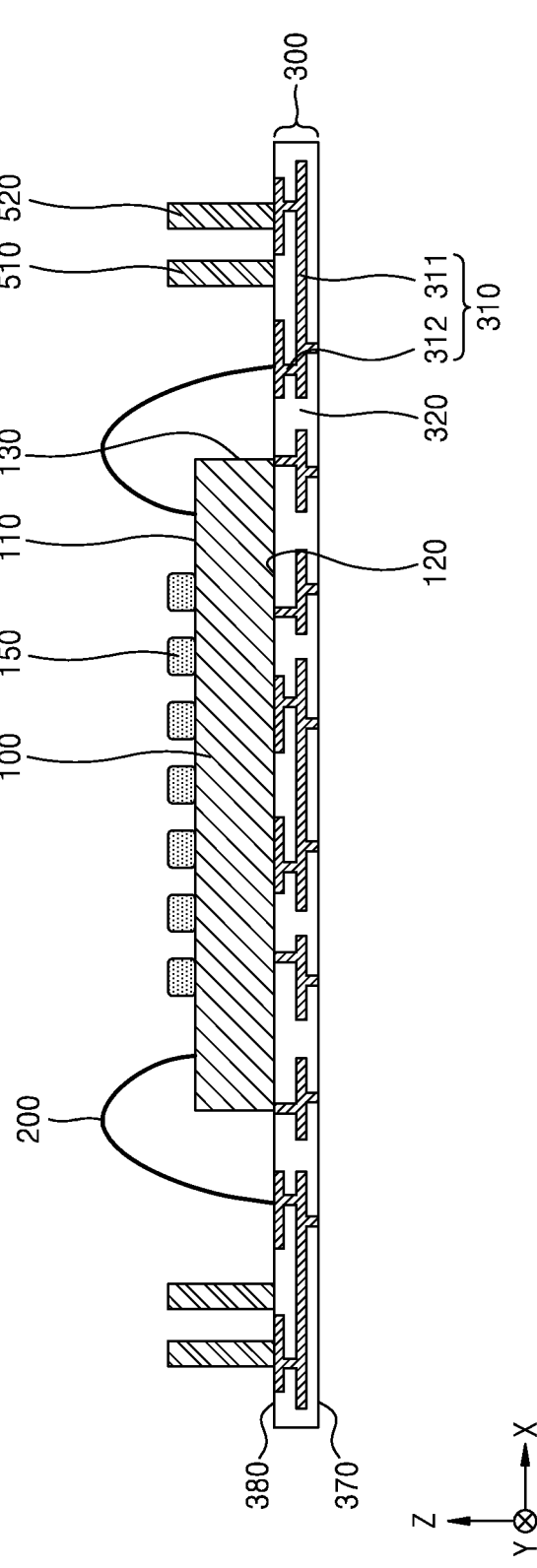

Referring to FIG. 7D, a wire 200 may connect an upper surface 120 (shown as a lower surface in FIG. 7D) of the first semiconductor chip 100 with the lower surface 380 of the upper redistribution structure 300. The wire 200 may be formed to be bent at a portion which is higher than a height of an upper end of each of the conductive posts 510 and 520 in a Z-axis direction or a height of an upper end of a conductive bump 150 in the Z-axis direction.

Figure 7E:
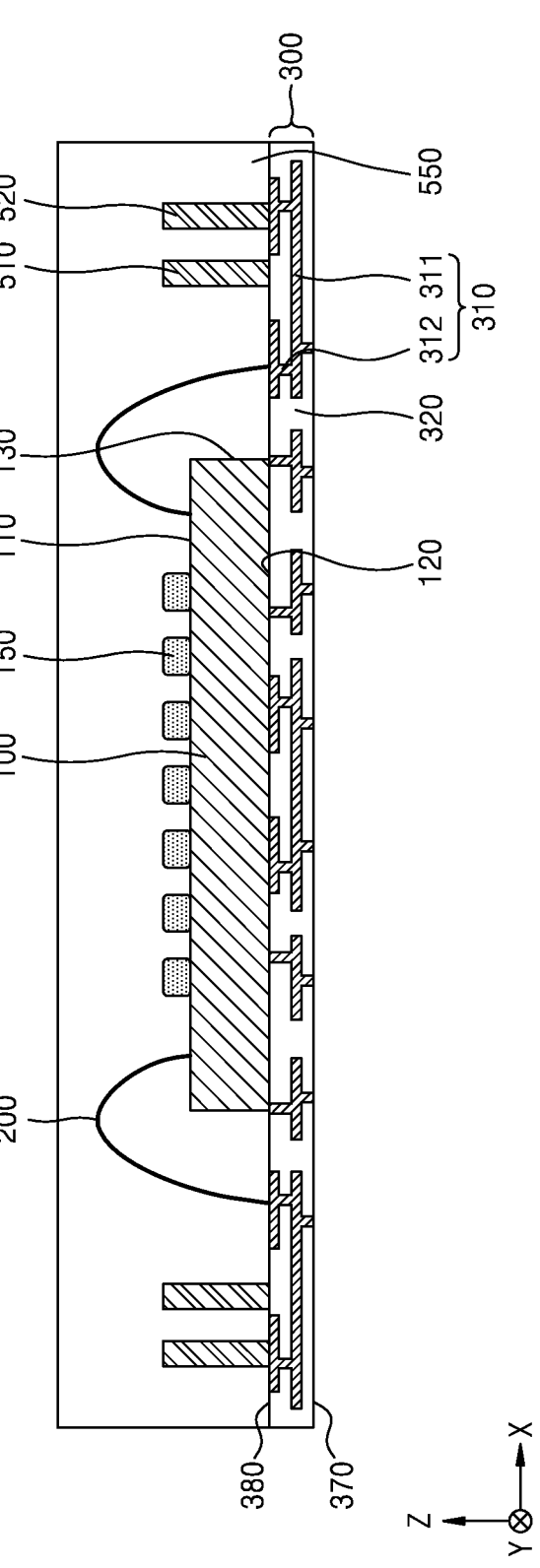

Referring to FIG. 7E, a molding layer 550 may be formed to surround semiconductor devices disposed on the upper redistribution structure 300. The molding layer 550 may be formed on the upper redistribution structure 300 to cover the first semiconductor chip 100 and the conductive posts 510 and 520. For example, the molding layer 550 may be formed through a molded underfill process.

Figure 7F:
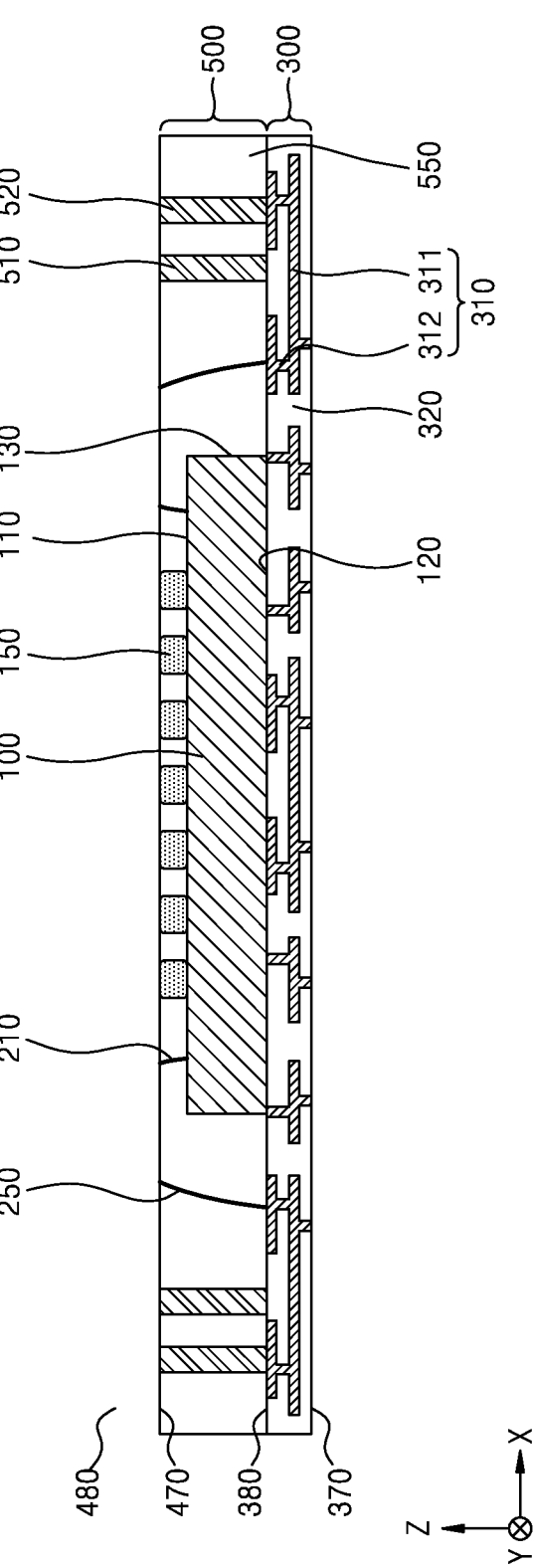

Referring to FIG. 7F, a polishing process may be performed on a resultant material of FIG. 7E so that the first semiconductor chip 100 and the conductive posts 510 and 520 are exposed. A portion of the molding layer 550, a portion of each of the conductive posts 510 and 520, and a portion of the wire 200 may be removed by the polishing process. As a result of the performed polishing process, an upper surface of the first semiconductor chip 100, an upper surface of the molding layer 550, an exposed surface of each of the conductive posts 510 and 520, and cut cross-sectional surfaces of the wire 200 may be planarized. A surface of the molding layer 550, a surface of the conductive bump 150, and a surface of each of the conductive posts 510 and 520 may be on the same plane. For example, the polishing process may include a grinding process using a diamond wheel, an etch-back process, and a chemical mechanical polishing process. The wire 200 may be divided into two portions by the polishing process. The divided second wire 250 may be divided into a first wire 210 and a second wire 250. As described above, the first wire 210 may connect the first semiconductor chip 100 with a surface of the lower redistribution structure 400 which is to be disposed in a process subsequent thereto. The second wire 250 may connect a surface of the upper redistribution structure 300 with a surface of the lower redistribution structure 400 which is to be disposed in a process subsequent thereto.

Figure 7G:
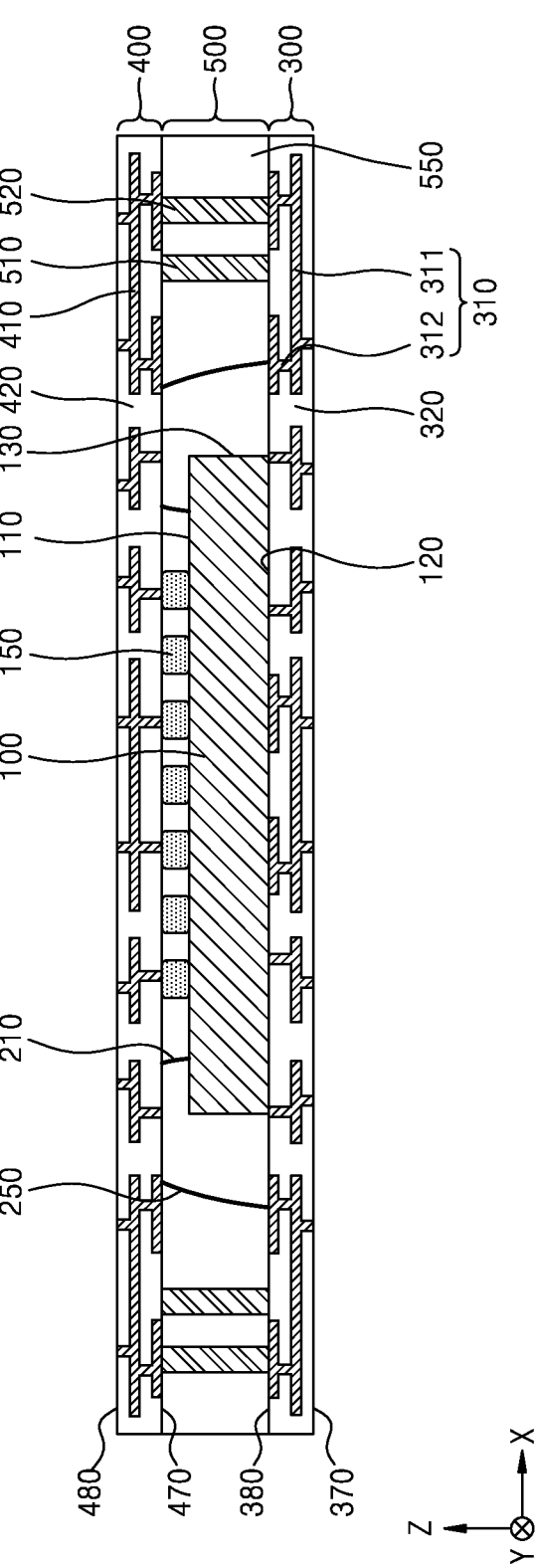
Figure 7H:
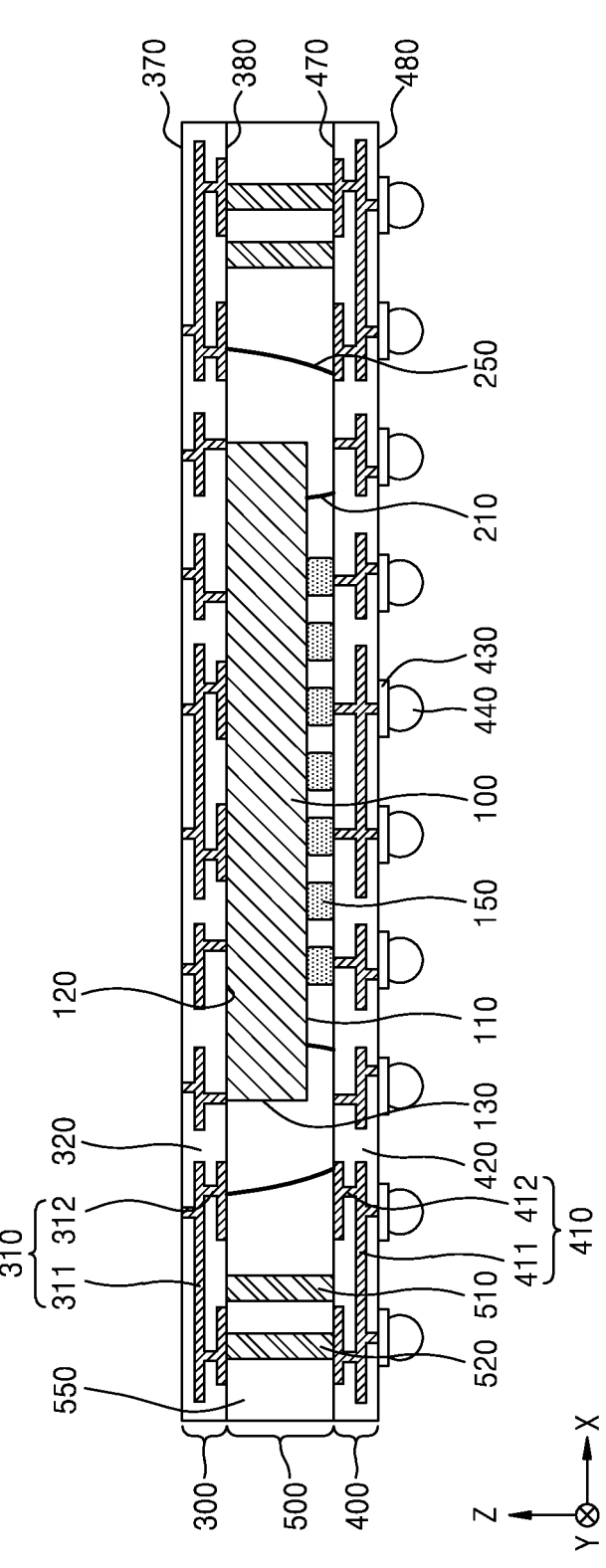

Referring to FIGS. 7G and 7H, the lower redistribution structure 400 may be disposed on an upper surface of a resultant material of FIG. 7F. In an embodiment, an insulation filler (not shown) may be formed to fill a gap between the lower redistribution structure 400 and the molding layer 550 and fill a gap between the lower redistribution structure 400 and the first semiconductor chip 100. At least a portion of the second wire 250, the conductive posts 510 and 520, and the conductive bump 150 may be electrically connected to the lower redistribution structure 400. FIG. 7H is a diagram illustrating an example where the semiconductor package of FIG. 7G is arranged such that upper redistribution structure is at a topside with respect to the diagram.

Non-limiting example embodiments have been described in the drawings and the specification. Example embodiments have been described by using the terms described herein, but these terms are merely used for describing non-limiting example embodiments of the present disclosure and have not been used for limiting a meaning or limiting the scope of the present disclosure. Therefore, the present disclosure is not limited to the example embodiments.

While embodiments of the present disclosure have been particularly shown and described with reference to the drawings, it will be understood that various changes in form and details may be made to embodiments without departing from the spirit and scope of the present disclosure.

What is claimed is:

1. A semiconductor package comprising:
a first semiconductor chip;
a lower redistribution structure electrically connected to the first semiconductor chip;
an upper redistribution structure on the first semiconductor chip;
a molding layer between the lower redistribution structure and the upper redistribution structure, the molding layer surrounding side surfaces of the first semiconductor chip and a lower surface of the first semiconductor chip;
a conductive post electrically connecting the upper redistribution structure to the lower redistribution structure; and
at least one first wire connecting a lower surface of the first semiconductor chip to an upper surface of the lower redistribution structure, the at least one first wire extending, in the molding layer, between the lower surface of the first semiconductor chip and the upper surface of the lower redistribution structure.

2. The semiconductor package of claim 1, wherein the first semiconductor chip is electrically connected to the lower redistribution structure via a conductive bump, and wherein the conductive bump is in the molding layer between the lower surface of the first semiconductor chip and the upper surface of the lower redistribution structure.

3. The semiconductor package of claim 1, wherein the at least one first wire comprises an inner first wire and an outer first wire arranged radially with respect to a center portion of the first semiconductor chip.

4. The semiconductor package of claim 1, wherein the at least one first wire connects the lower surface of the first semiconductor chip to a portion of the upper surface of the lower redistribution structure, the portion not overlapping with the first semiconductor chip.

5. The semiconductor package of claim 1, wherein the at least one first wire connects the lower surface of the first semiconductor chip to a portion of the upper surface of the lower redistribution structure, the portion overlapping with the first semiconductor chip.

6. The semiconductor package of claim 1, wherein the at least one first wire comprises a plurality of first wires, and adjacent ones of the plurality of first wires are spaced apart uniformly from each other.

7. The semiconductor package of claim 1, wherein the at least one first wire comprises a plurality of first wires that are provided in a first region and a second region, wherein a density of the plurality of first wires in the first region is greater than a density of the plurality of first wires in the second region.

8. The semiconductor package of claim 1, further comprising a second semiconductor chip on an upper surface of the upper redistribution structure and electrically connected to a redistribution layer of the semiconductor package.

9. The semiconductor package of claim 1, wherein the first semiconductor chip is electrically connected to the lower redistribution structure via a conductive pad.

10. A semiconductor package comprising:
a first semiconductor chip;
a lower redistribution structure electrically connected to the first semiconductor chip;
an upper redistribution structure on the first semiconductor chip;
a molding layer between the lower redistribution structure and the upper redistribution structure, the molding layer surrounding side surfaces of the first semiconductor chip and a lower surface of the first semiconductor chip;
a conductive post electrically connecting the upper redistribution structure to the lower redistribution structure;
at least one first wire connecting a lower surface of the first semiconductor chip to an upper surface of the lower redistribution structure, the at least one first wire extending, in the molding layer, between the lower surface of the first semiconductor chip and the upper surface of the lower redistribution structure; and
at least one second wire connecting the upper surface of the lower redistribution structure to a lower surface of the upper redistribution structure, the at least one second wire extending, in a portion of the molding layer that surrounds the side surfaces of the first semiconductor chip, between the upper surface of the lower redistribution structure and the lower surface of the upper redistribution structure.

11. The semiconductor package of claim 10, wherein at least a portion of the at least one second wire electrically connects the upper surface of the lower redistribution structure to the lower surface of the upper redistribution structure.

12. The semiconductor package of claim 10, wherein the at least one second wire comprises one or more from among gold (Au), silver (Ag), and copper (Cu).

13. The semiconductor package of claim 10, wherein a total number of the at least one first wire is equal to a total number of the at least one second wire.

14. The semiconductor package of claim 10, wherein the at least one first wire comprises an inner first wire and an outer first wire arranged radially with respect to a center portion of the first semiconductor chip.

15. The semiconductor package of claim 10, wherein the at least one second wire comprises an inner second wire and an outer second wire arranged radially with respect to a center portion of the first semiconductor chip.

16. The semiconductor package of claim 10, wherein the at least one first wire connects the lower surface of the first semiconductor chip to a portion of the upper surface of the lower redistribution structure, the portion not overlapping with the first semiconductor chip.

17. The semiconductor package of claim 10, wherein at least one from among the at least one first wire and the at least one second wire comprises a plurality of wires that are provided in a first region and a second region, wherein a density of the plurality of wires in the first region is greater than a density of the plurality of wires in the second region.

18. The semiconductor package of claim 10, wherein the at least one first wire comprise a pair of first wires that are connected to the lower surface of the first semiconductor chip.

19. The semiconductor package of claim 10, further comprising a second semiconductor chip on an upper surface of the upper redistribution structure and electrically connected to a redistribution layer of the semiconductor package.

20. A semiconductor package comprising:
a first semiconductor chip;

a lower redistribution structure electrically connected to the first semiconductor chip;

an upper redistribution structure on the first semiconductor chip;

a molding layer between the lower redistribution structure and the upper redistribution structure, the molding layer surrounding side surfaces of the first semiconductor chip and a lower surface of the first semiconductor chip;

a conductive post electrically connecting the upper redistribution structure to the lower redistribution structure;

a second semiconductor chip on an upper surface of the upper redistribution structure and electrically connected to a redistribution layer of the semiconductor package;

at least one first wire connecting a lower surface of the first semiconductor chip with an upper surface of the lower redistribution structure, the at least one first wire extending, in the molding layer, between the lower surface of the first semiconductor chip and the upper surface of the lower redistribution structure; and at least one second wire connecting the upper surface of the lower redistribution structure to a lower surface of the upper redistribution structure, the at least one second wire extending, in a portion of the molding layer that surrounds the side surfaces of the first semiconductor chip, between the upper surface of the lower redistribution structure and the lower surface of the upper redistribution structure, wherein at least a portion of the at least one second wire electrically connects the upper surface of the lower redistribution structure to the lower surface of the upper redistribution structure, and wherein a total number of the at least one first wire is equal to a total number of the at least one second wire.

* * * * *